(12) United States Patent
Tanimoto

(10) Patent No.: US 8,122,402 B2
(45) Date of Patent: Feb. 21, 2012

(54) EQUIVALENCE CHECKING METHOD, EQUIVALENCE CHECKING PROGRAM, AND GENERATING METHOD FOR EQUIVALENCE CHECKING PROGRAM

(75) Inventor: Tadaaki Tanimoto, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 414 days.

(21) Appl. No.: 12/396,309

(22) Filed: Mar. 2, 2009

(65) Prior Publication Data

US 2009/0241074 A1 Sep. 24, 2009

(30) Foreign Application Priority Data

Mar. 24, 2008 (JP) .................................. 2008-074859

(51) Int. Cl.
*G06F 17/50* (2006.01)
(52) U.S. Cl. ......... 716/107; 716/101; 716/103; 716/106
(58) Field of Classification Search .................. 716/101, 716/103, 106, 107
See application file for complete search history.

(56) References Cited

U.S. PATENT DOCUMENTS

| | | | | |
|---|---|---|---|---|
| 6,484,135 B1 * | 11/2002 | Chin et al. | ...................... | 703/23 |
| 7,003,742 B2 * | 2/2006 | Saxena et al. | ................. | 716/102 |
| 7,340,700 B2 * | 3/2008 | Emerson et al. | ............... | 716/111 |
| 7,607,116 B2 * | 10/2009 | Kwon | ........................... | 716/106 |
| 2003/0131324 A1 | 7/2003 | Takenaka | | |

FOREIGN PATENT DOCUMENTS

| | | | |
|---|---|---|---|
| JP | 2003-141202 A | 5/2003 | |
| JP | 2004-145712 A | 5/2004 | |
| JP | 2005-316595 A | 11/2005 | |

* cited by examiner

*Primary Examiner* — Sun Lin
(74) *Attorney, Agent, or Firm* — Miles & Stockbridge P.C.

(57) ABSTRACT

To provide a checking method that utilizes a test bench for a circuit model, which will serve as a fundamental for equivalence checking of a circuit to be newly developed for the fundamental circuit model. In order to check the equivalence of a model to be verified using a sample model a circuit of which has been described in a predetermined language and a test vector generation model for the sample model, a process for writing an output from the sample model test vector generation model into an input FIFO group for each signal of the sample model with the same timing as that of the sample model while the sample model is inputting/outputting a signal from/to the sample model test vector generation model with cycle accuracy and a process for reading data from the input FIFO group with the same operation timing as that of the model to be verified and outputting the data to the model to be verified are carried out. The output of the sample model and the output of the model to be verified are written into an output FIFO pair group for each corresponding signal name and coincidence judgment is carried out for a pair output for each written signal name.

21 Claims, 52 Drawing Sheets

FIG. 7

MODULE NAME/PORT DESCRIPTION PART OF SAMPLE MODEL AND TRANSFORMATION RESULT

```
#include "systemc.h"
#include <cstdio>
#include <stdlib.h>

SC_MODULE( sakura ) {
  sc_in_clk clk;
  sc_in < bool > rst;
  sc_in < char > in_kerochan;
  sc_in < char > in_yue;
  sc_in < int > in_sakura;
  sc_in < int > in_wood;
  sc_in < int > in_fly;
  sc_out < int > out_sakura_cards;
  unsigned long long int tomoyo;

void th_CardCapter();

SC_CTOR( sakura ) {
    SC_CTHREAD( th_CardCapter, clk.pos() );
    reset_signal_is( rst, false );
  }
};
```

TRANSFORMATION

```
#include "systemc.h"
#include <cstdio>
#include <stdlib.h>

SC_MODULE( fifo_sakura ) {
  sc_in_clk clk;
  sc_in < bool > rst;
  sc_in < char > in_kerochan;
  sc_in < char > in_yue;
  sc_in < int > in_sakura;
  sc_in < int > in_wood;
  sc_in < int > in_fly;
  sc_signal < int > out_sakura_cards;
  unsigned long long int tomoyo;

void th_CardCapter();
  void fifo_kerochan(char rst, char rw_flg, char wdata, char* rdata);
  void fifo_yue(char rst, char rw_flg, char wdata, char* rdata);
  void fifo_sakura(char rst, char rw_flg, int wdata, int * rdata);
  void fifo_wood(char rst, char rw_flg, int wdata, int * rdata);
  void fifo_fly(char rst, char rw_flg, int wdata, int * rdata);

SC_CTOR( fifo_sakura ) {
    SC_CTHREAD( th_CardCapter, clk.pos() );
    reset_signal_is( rst, false );
  }
};
```

FIG. 8

MODULE NAME/PORT DESCRIPTION PART OF MODEL TO BE VERIFIED AND TRANSFORMATION RESULT

```
#include "systemc.h"
#include <cstdio>
#include <stdlib.h>

SC_MODULE( sakura_dut ) {
    sc_in_clk clk;
    sc_in < bool > rst;
    sc_in < char > in_kerochan;
    sc_in < char > in_yue;
    sc_in < int > in_sakura;
    sc_in < int > in_wood;
    sc_in < int > in_fly;
    sc_out < int > out_sakura_cards;
    unsigned long long int tomoyo;

void th_CardCapterDut();

SC_CTOR( sakura_dut ){
        SC_CTHREAD( th_CardCapterDut, clk.pos() );
        reset_signal_is( rst, false );
    }
};
```

⇧ TRANSFORMATION & EMBEDMENT

```
#include "systemc.h"
#include <cstdio>
#include <stdlib.h>

SC_MODULE( fifo_sakura ) {
    sc_in_clk clk;
    sc_in < bool > rst;
    sc_in < char > in_kerochan;
    sc_in < char > in_yue;
    sc_in < int > in_sakura;
    sc_in < int > in_wood;
    sc_in < int > in_fly;
    sc_signal < unsigned int > out_sakura_cards;
    unsigned long long int tomoyo;
    sc_out < char >  in_kerochan;
    sc_out < char >  in_yue;
    sc_out < int >  in_sakura;
    sc_out < int >  in_wood;
    sc_out < int >  in_fly;
    unsigned long long int _tomoyo;

void th_CardCapter();
    void fifo_kerochan(char rst, char rw_flg, char wdata, char* rdata);
    void fifo_yue(char rst, char rw_flg, char wdata, char* rdata);
    void fifo_sakura(char rst, char rw_flg, int wdata, int * rdata);
    void fifo_wood(char rst, char rw_flg, int wdata, int * rdata);
    void fifo_fly(char rst, char rw_flg, int wdata, int * rdata);
    void _th_CardCapterDut();

SC_CTOR( fifo_sakura ){
        SC_CTHREAD( th_CardCapter, clk.pos() );
        reset_signal_is( rst, false );
        SC_CTHREAD( _th_CardCapterDut, clk.pos() );
        reset_signal_is( rst, false );
    }
};
```

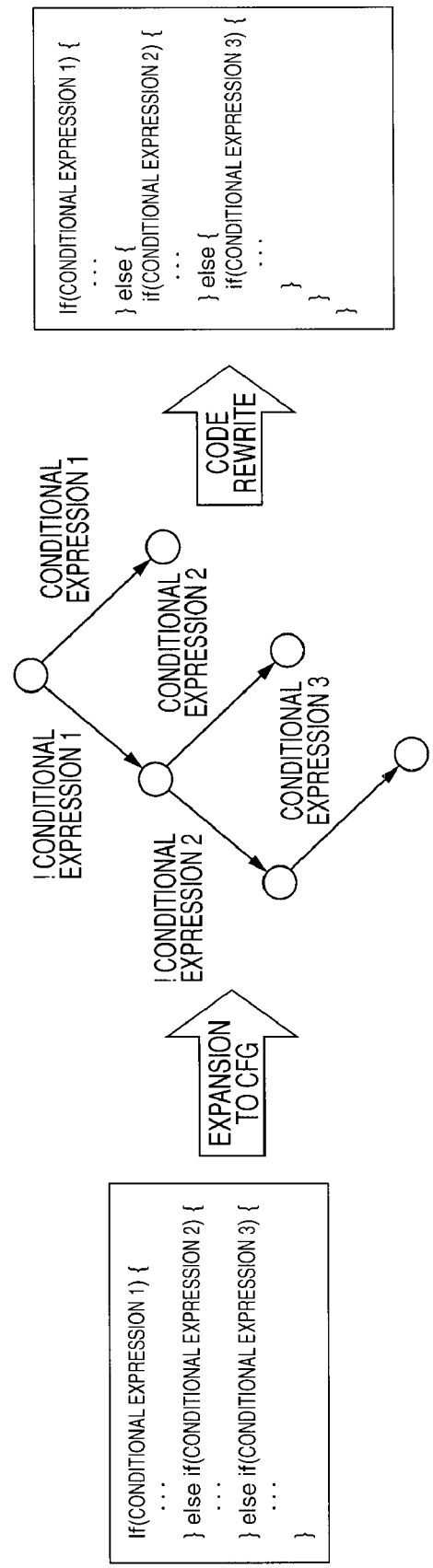

FIG. 10
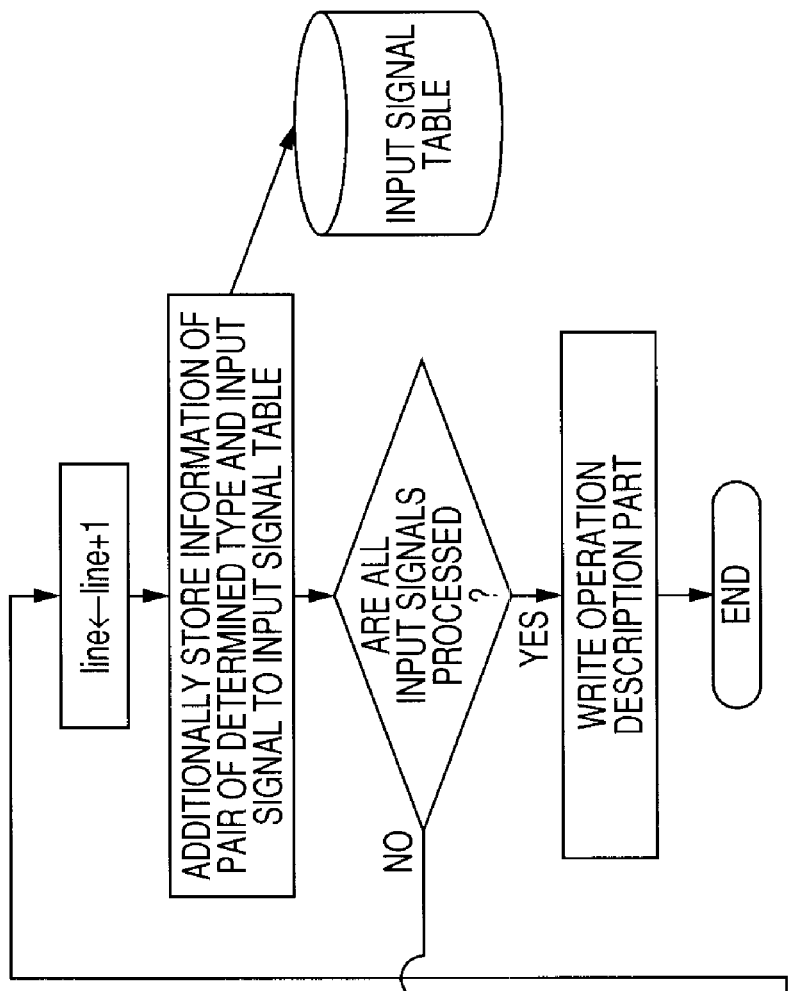
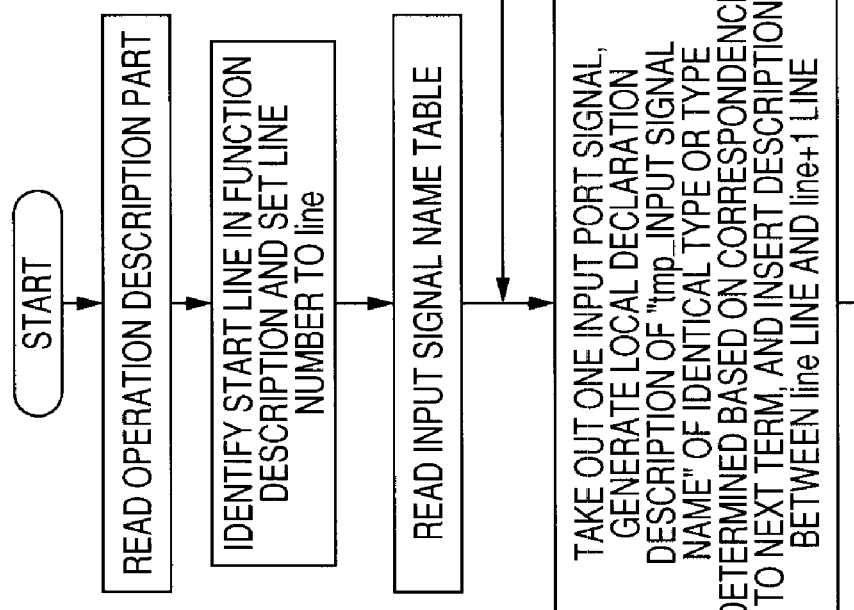

FIG. 11

```
sc_int<1> ~ sc_int<8>      char
sc_int<9> ~ sc_int<16>     short
sc_int<17> ~ sc_int<32>    int
sc_int<33> ~ sc_int<64>    long long int
sc_uint<1> ~ sc_uint<8>    unsigned char
sc_uint<9> ~ sc_uint<16>           unsigned short
sc_uint<17> ~ sc_uint<32>          unsigned int
sc_uint<33> ~ sc_uint<64>          unsigned long long int
```

OPERATION DESCRIPTION PART OF SAMPLE MODEL AND TRANSFORMATION RESULT

FIG. 15

OPERATION DESCRIPTION PART OF MODEL TO BE VERIFIED AND TRANSFORMATION RESULT

```
#include "sakura_dut_s.h"
void sakura_dut::th_CardCapterDut() {
  out_sakura_cards_.write(0);
  tomoyo = 0;
  wait();
  while (1) {
    if(in_kerochan.read()) {
      out_sakura_cards_.write((int) tomoyo);
      wait();
      tomoyo *= in_wood.read();
    } else if(in_yue.read()) {
      tomoyo = in_sakura.read();
      wait();
      tomoyo *= in_fly.read();
      out_sakura_cards_.write((int) tomoyo);
    }
    wait();
  }
}
```

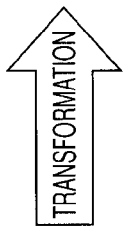
TRANSFORMATION

```
#include "sakura.h"
void fifo_sakura::_th_CardCapterDut() {
  char tmp_in_kerochan;
  char tmp_in_yue;
  int tmp_in_sakura;
  int tmp_in_wood;
  int tmp_in_fly;
  out_sakura_cards_.write(0);
  tomoyo = 0;
  wait();
  while (1) {
    fifo_in_kerochan(1, 1, 0, &tmp_in_kerochan);
    in_kerochan.write(tmp_in_kerochan);
    if(tmp_in_kerochan) {
      out_sakura_cards_.write((int) tomoyo);
      wait();
      tomoyo *= in_wood.read();
      fifo_in_wood(1, 1, 0, &tmp_in_wood);
      in_wood.write(tmp_in_wood);
    } else {
      fifo_in_yue(1, 1, 0, &tmp_in_yue);
      in_yue.write(tmp_in_yue);
      if(tmp_in_yue) {
        tomoyo = in_sakura.read();
        fifo_in_sakura(1, 1, 0, &tmp_in_sakura);
        in_sakura.write(tmp_in_sakura);
        wait();
        tomoyo *= in_fly.read();
        fifo_in_fly(1, 1, 0, &tmp_in_fly);
        in_fly.write(tmp_in_fly);
        out_sakura_cards_.write((int) tomoyo);
      }
    }
    wait();
  }
}
```

FIG. 17

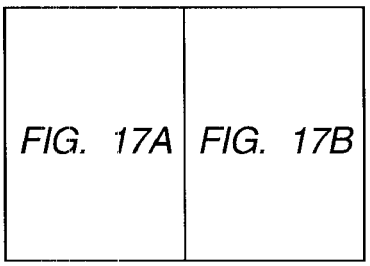

FIG. 17A

TRANSFORMATION RESULT OF SUBSEQUENT MODIFICATION PROCESS
OF MODULE NAME/PORT DECLARATION DESCRIPTION PART

```
#include "systemc.h"
#include <cstdio>
#include <stdlib.h>

SC_MODULE( fifo_sakura ) {
  sc_in_clk clk;
  sc_in < bool > rst;
  sc_in < char > in_kerochan;
  sc_in < char > in_yue;
  sc_in < int > in_sakura;
  sc_in < int > in_wood;
  sc_in < int > in_fly;
  sc_signal < unsigned int > out_sakura_cards;
  unsigned long long int tomoyo;
  sc_out < char > _in_kerochan;
  sc_out < char > _in_yue;
  sc_out < int > _in_sakura;
  sc_out < int > _in_wood;
  sc_out < int > _in_fly;
  unsigned long long int _tomoyo;

void th_CardCapter();
  void fifo_kerochan(char rst, char rw_flg, char wdata, char* rdata);
  void fifo_yue(char rst, char rw_flg, char wdata, char* rdata);
  void fifo_sakura(char rst, char rw_flg, int wdata, int * rdata);
  void fifo_wood(char rst, char rw_flg, int wdata, int * rdata);
  void fifo_fly(char rst, char rw_flg, int wdata, int * rdata);
  void _th_CardCapterDut();

SC_CTOR( fifo_sakura ) {
    SC_CTHREAD( th_CardCapter, clk.pos() );
    reset_signal_is( rst, false );
    SC_CTHREAD( _th_CardCapterDut, clk.pos() );
    reset_signal_is( rst, false );
  }
};
```

TRANSFORMATION

FIG. 17B

```cpp
#include "systemc.h"
#include <cstdio>
#include <stdlib.h>
SC_MODULE( fifo_sakura ) {
  sc_in_clk clk;
  sc_in_clk clk2;
  sc_in < bool > rst;
  sc_in < char > in_kerochan;
  sc_in < char > in_yue;
  sc_in < int > in_sakura;
  sc_in < int > in_wood;
  sc_in < int > in_fly;
  sc_signal < unsigned int > out_sakura_cards;
  unsigned long long int tomoyo;
  sc_out < char > _in_kerochan;
  sc_out < char > _in_yue;
  sc_out < int > _in_sakura;
  sc_out < int > _in_wood;
  sc_out < int > _in_fly;
  unsigned long long int _tomoyo;
  sc_out < bool > in_kerochanEmpty;
  sc_out < bool > in_kerochanEmptyAlart;
  sc_out < bool > in_kerochanFull;
  sc_out < bool > in_kerochanFullAlart;
  sc_out < bool > in_kerochanStart;
  sc_out < bool > in_yueEmpty;
  sc_out < bool > in_yueEmptyAlart;
  sc_out < bool > in_yueFull;
  sc_out < bool > in_yueFullAlart;
  sc_out < bool > in_yueStartt;
  sc_out < bool > in_sakuraEmpty;
  sc_out < bool > in_sakuraEmptyAlart;
  sc_out < bool > in_sakuraFull;
  sc_out < bool > in_sakuraFullAlart;
  sc_out < bool > in_sakuraStart;
  sc_out < bool > in_woodEmpty;
  sc_out < bool > in_woodEmptyAlart;
  sc_out < bool > in_woodFull;
  sc_out < bool > in_woodFullAlart;
  sc_out < bool > in_woodStart;
  sc_out < bool > in_flyEmpty;
  sc_out < bool > in_flyEmptyAlart;
  sc_out < bool > in_flyFull;
  sc_out < bool > in_flyFullAlart;
  sc_out < bool > in_flyStart;

void th_CardCapter();
  void fifo_kerochan(char rst, char rw_flg, char wdata, char* rdata);
  void fifo_yue(char rst, char rw_flg, char wdata, char* rdata);
  void fifo_sakura(char rst, char rw_flg, int wdata, int * rdata);
  void fifo_wood(char rst, char rw_flg, int wdata, int * rdata);
  void fifo_fly(char rst, char rw_flg, int wdata, int * rdata);
  void _th_CardCapterDut();

SC_CTOR( fifo_sakura ) {
    SC_CTHREAD( th_CardCapter, clk.pos() );
    reset_signal_is( rst, false );
    SC_CTHREAD( _th_CardCapterDut, clk2.neg() );
    reset_signal_is( rst, false );
  }
};
```

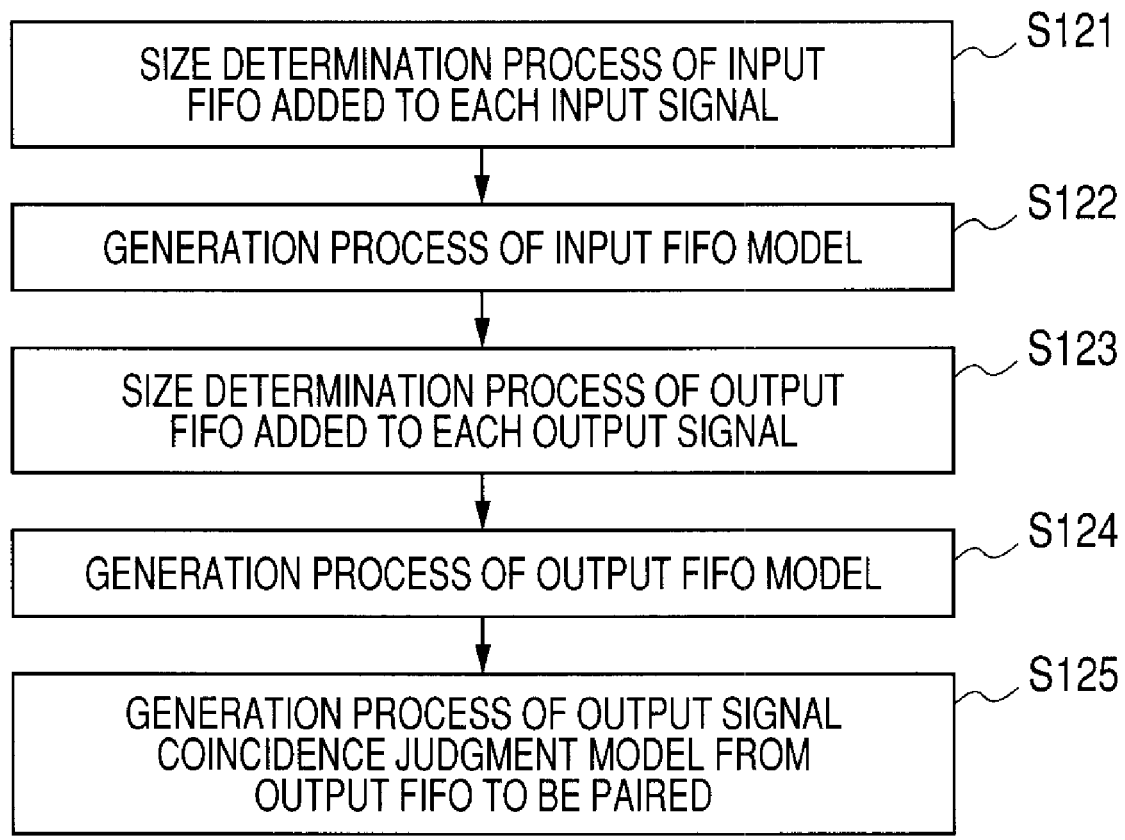

FIG. 21

INPUT FIFO DESCRIPTION WHEN THERE IS NOT THRESHOLD VALUE
SETTING OF INCREASE IN SIZE

```
#include "_FILE NAME OF SAMPLE MODEL"

void fifi_MODULE NAME OF SAMPLE MODEL::fifo_INPUT SIGNAL NAME
(char rst, char rw_flg, TYPE OF INPUT SIGNAL wdata, TYPE OF INPUT SIGNAL* rdata)
{
  static bool              half;
  static bool              init_flg = 0;
  static unsigned long long int  empty_th;
  static unsigned long long int  half_th;
  static unsigned long long int  full_th;
  static unsigned long long int  r_ptr;
  static unsigned long long int  w_ptr;
  static unsigned long long int  fifo_depth;
  static unsigned long long int  fifo_div;
  static TYPE OF INPUT SIGNAL    *mem;
  static TYPE OF INPUT SIGNAL    *mem_tmp;
  static unsigned long long int  data_cnt;

/* initialization via reset signal */
  if(rst == 0) {
    fifo_depth = POSITIVE VALUE FOUND BY FIFO STAGE NUMBER DETERMINATION MEANS;
    mem = new  (TYPE OF INPUT SIGNAL) [fifo_depth];
    r_ptr = 0;
    w_ptr = 0;
    data_cnt = 0;
    fifo_div = VALUE N INPUT BY FIFO STAGE NUMBER DETERMINATION MEANS;
    empty_th = (fifo_depth*1)/fifo_div;
    full_th  = (fifo_depth*(fifo_div-1))/fifo_div;
    half_th  = fifo_depth>>1;
    INPUT SIGNAL NAME  Empty.write(1);
    INPUT SIGNAL NAME  Full.write(0);
    INPUT SIGNAL NAME  EmptyAlart.write(1);
    INPUT SIGNAL NAME  FullAlart.write(0);
    init_flg = 0;
  } else {
```

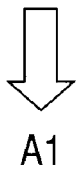

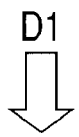

D1

```
/* Simultaneous read and write operations never happen. */
/* Wraparound never happen. */
if(rw_flg == 1) {
  /* read operation */
  if(init_flg == 1) {
    *rdata = mem[r_ptr];
    r_ptr++;
    data_cnt--;
  }
} else {
  /* write operation */
  mem[w_ptr] = wdata;
  data_cnt++;
  if(w_ptr == fifo_depth - 1) {
    fifo_depth <<= 1;
    fifo_div <<= 1;
    mem_tmp = new (TYPE OF INPUT SIGNAL) [fifo_depth];
    mem_tmp = (TYPE OF INPUT SIGNAL*) memmove(mem_tmp, mem, sizeof(TYPE OF INPUT SIGNAL)*fifo_depth);
    delete [] mem;
    mem = new (TYPE OF INPUT SIGNAL)[fifo_depth];
    mem = (TYPE OF INPUT SIGNAL*) memmove(mem, mem_tmp, sizeof(TYPE OF INPUT SIGNAL)*fifo_depth);
    delete [] mem_tmp;
  }
  w_ptr++;
}

/* threshold definition and updata */
empty_th = (fifo_depth*1)/fifo_div;
full_th  = (fifo_depth*(fifo_div-1))/fifo_div;
half_th  = fifo_depth>>1;

/* fifo condition check */
  INPUT SIGNAL NAME Empty.write((data_cnt <= empty_th));
  INPUT SIGNAL NAME EmptyAlart.write((data_cnt == 0));
  half = (data_cnt >= half_th);
  INPUT SIGNAL NAME Full.write((data_cnt >= full_th));
  INPUT SIGNAL NAME FullAlart.write((data_cnt == fifo_depth));
  if(half == 1) init_flg = 1;
  INPUT SIGNAL NAME Start.write(init_flg);
  }
}
```

FIG. 23

GENERATION OF INPUT FIFO DESCRIPTION WHEN THERE IS THRESHOLD VALUE SETTING OF INCREASE IN SIZE

```
#include "_FILE NAME OF SAMPLE MODEL"

void fifo_MODULE NAME OF SAMPLE MODEL::fifo_INPUT SIGNAL NAME
(char rst, char rw_flg, TYPE OF INPUT SIGNAL wdata, TYPE OF INPUT SIGNAL *rdata)
{
  static bool              wrap = 0;
  static bool              read_once_executed = 0;
  static bool              pre_sizeup = 0;
  static bool              half;
  static bool              init_flg = 0;
  static unsigned long long int  empty_th;
  static unsigned long long int  half_th;
  static unsigned long long int  full_th;
  static unsigned long long int  r_ptr;
  static unsigned long long int  w_ptr;
  static unsigned long long int  fifo_depth;
  static unsigned long long int  fifo_depth_shadow;
  static unsigned long long int  fifo_div;
  static TYPE OF INPUT SIGNAL    *mem;
  static TYPE OF INPUT SIGNAL    *mem_tmp;
  static unsigned long long int  data_cnt;

/* initialization via reset signal */
  if(rst == 0) {
    wrap = 0;
    fifo_depth = POSITIVE VALUE FOUND BY FIFO STAGE NUMBER DETERMINATION MEANS;
    fifo_depth_shadow = fifo_depth;
    read_once_executed = 0;
    mem = new (TYPE OF INPUT SIGNAL) [fifo_depth];
    r_ptr = 0;
    w_ptr = 0;
    data_cnt = 0;
    fifo_div = VALUE N INPUT BY FIFO STAGE NUMBER DETERMINATION MEANS;
    empty_th = (fifo_depth*1)/fifo_div;
    full_th  = (fifo_depth*(fifo_div-1))/fifo_div;
    half_th  = fifo_depth>>1;
    INPUT SIGNAL NAME Empty.write(1);
    INPUT SIGNAL NAME EmptyAlart.write(1);
    INPUT SIGNAL NAME Full.write(0);
    INPUT SIGNAL NAME FullAlart.write(0);
    init_flg = 0;
```

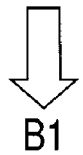

```
} else {
  /* Simultaneous read and write operations never happen. */
  if(rw_flg == 1) {
    /* read operation */
    if(init_flg == 1) {
      read_once_executed = 1;
      *rdata = mem[r_ptr];
      if(wrap == 1) {
        if(r_ptr == fifo_depth_shadow - 1) {
          r_ptr = 0;
          wrap = 0;
        } else {
          r_ptr++;
        }
      } else {
        if(r_ptr == fifo_depth - 1) {
          r_ptr = 0;
        } else {
          r_ptr++;
        }
      }
      data_cnt--;
    }
  } else {
    /* write operation */
    mem[w_ptr] = wdata;
    data_cnt++;
    if(w_ptr == fifo_depth - 1) {
      if(read_once_executed == 0) {
        fifo_depth <<= 1;
        fifo_div <<= 1;
        mem_tmp = new (TYPE OF INPUT SIGNAL)[fifo_depth];
        mem_tmp = (TYPE OF INPUT SIGNAL*)memmove(mem_tmp, mem, sizeof(TYPE OF INPUT SIGNAL)*fifo_depth);
        delete [] mem;
        mem = new (TYPE OF INPUT SIGNAL) [fifo_depth];
        mem = (TYPE OF INPUT SIGNAL*) memmove(mem, mem_tmp, sizeof(TYPE OF INPUT SIGNAL)*fifo_depth);
        delete [] mem_tmp;
        w_ptr++;
      } else {
        if(w_ptr - r_ptr > THRESHOLD VALUE OR THRESHOLD VARIABLE SPECIFIED BY INCREASE IN FIFO STAGE NUMBER ) {
          /* Read is much slower than write. */
          fifo_depth <<= 1;
          fifo_div <<= 1;
          mem_tmp = new (TYPE OF INPUT SIGNAL) [fifo_depth];
          mem_tmp = (TYPE OF INPUT SIGNAL*) memmove(mem_tmp, mem, sizeof(TYPE OF INPUT SIGNAL)*fifo_depth);
          delete [] mem;
          mem = new (TYPE OF INPUT SIGNAL)[fifo_depth];
          mem = (TYPE OF INPUT SIGNAL*)memmove(mem, mem_tmp, sizeof(TYPE OF INPUT SIGNAL)*fifo_depth);
          delete [] mem_tmp;
          w_ptr++;
        } else {
          fifo_depth_shadow = fifo_depth;
          w_ptr = 0;
          wrap = 1;
        }
      }
    } else {
      w_ptr++;
    }
  }
}
```

```
/* threshold definition and update */
empty_th = (fifo_depth*1)/fifo_div;
full_th  = (fifo_depth*(fifo_div-1))/fifo_div;
half_th  = fifo_depth>>1;

/* fifo condition check */
INPUT SIGNAL NAME Empty.write((data_cnt <= empty_th));
INPUT SIGNAL NAME EmptyAlart.write((data_cnt == 0));
half = (data_cnt >= half_th);
INPUT SIGNAL NAME Full.write((data_cnt >= full_th));
INPUT SIGNAL NAME FullAlart.write((data_cnt == fifo_depth)&&(read_once_executed == 1));
if(half == 1) init_flg = 1;
INPUT SIGNAL NAME _start.write(init_flg);
  }
}
```

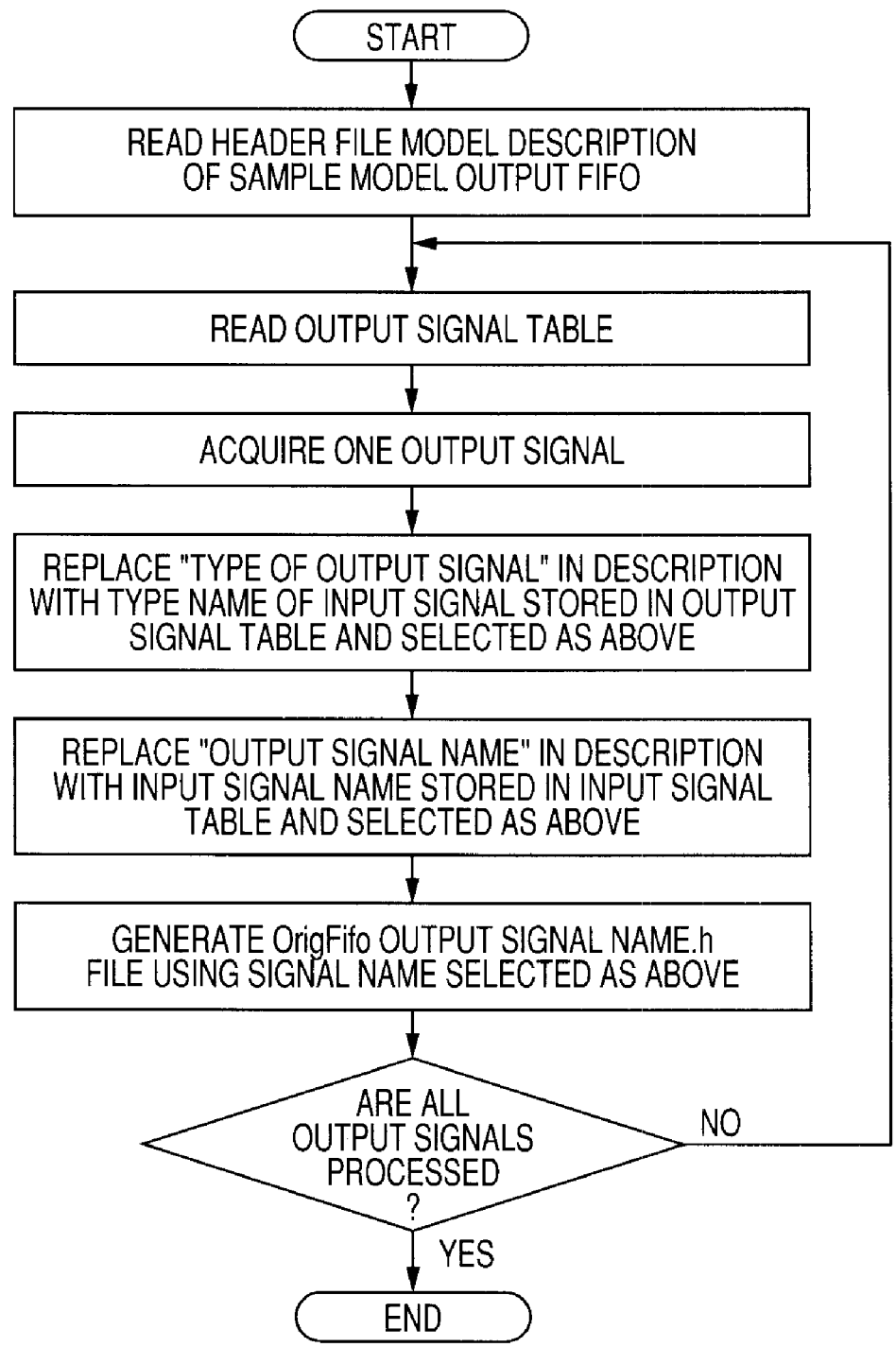

FIG. 28

MODEL DESCRIPTION OF HEADER FILE OF SAMPLE MODEL OUTPUT FIFO

```
SC_MODULE( OrigFifo OUTPUT SIGNAL NAME ) {
  sc_in_clk clk;
  sc_in < bool > rst;
  sc_in < bool > Orig OUTPUT SIGNAL NAME Read;
  sc_in <TYPE OF OUTPUT SIGNAL > OUTPUT SIGNAL NAME;
  sc_out < bool > Orig OUTPUT SIGNAL NAME Empty;
  sc_out < TYPE OF OUTPUT SIGNAL > Orig OUTPUT SIGNAL NAME;
  sc_out < unsigned long long int > Orig OUTPUT SIGNAL NAME Clk;

void fifo();

SC_CTOR( OrigFifo OUTPUT SIGNAL NAME ) {
    SC_CTHREAD( fifo, clk.pos() );
    reset_signal_is( rst, false );

}
};
```

GENERATION OF OPERATION DESCRIPTION FILE OF SAMPLE MODEL OUTPUT FIFO

FIG. 30

MODEL DESCRIPTION OF OPERATION DESCRIPTION FOR UNCONDITIONED INCREASE IN SIZE OF SAMPLE MODEL OUTPUT FIFO

```
#include "OrigFifo OUTPUT SIGNAL NAME .h"
void OrigFifo OUTPUT SIGNAL NAME::fifo()
{ static TYPE OF OUTPUT SIGNAL    pre_out;
  static bool                     empty;
  static unsigned long long int   r_ptr;
  static unsigned long long int   w_ptr;
  static unsigned long long int   fifo_depth;
  static unsigned long long int   fifo_div;
  static TYPE OF OUTPUT SIGNAL    *mem;
  static TYPE OF OUTPUT SIGNAL    *mem_tmp;
  static unsigned long long int   *clk_mem;
  static unsigned long long int   *clk_mem_tmp;
  static unsigned long long int   data_cnt;
  static bool                     init_flg = 0;
  static unsigned long long int   ClkCnt = 0;
  wrap = 0;
  fifo_depth = VALUE DETERMINED BY OUTPUT FIFO STAGE NUMBER DETERMINATION MEANS;
  mem = new (TYPE OF OUTPUT SIGNAL)[fifo_depth];
  clk_mem = new (unsigned long long int)[fifo_depth];
  empty = 0;
  r_ptr = 0;
  w_ptr = 0;
  data_cnt = 0;
  pre_out = 0;
  Orig OUTPUT SIGNAL NAME Empty.write(1);
  init_flg = 0;
  ClkCnt = 0;
  wait();
```

```
while (1) {
    if(init_flg == 0 || pre_out != OUTPUT SIGNAL NAME.read()) {
        /* write operation */
        mem[w_ptr] = OUTPUT SIGNAL NAME.read();
        clk_mem[w_ptr] = ClkCnt;
        data_cnt++;
        if(w_ptr == fifo_depth - 1) {
            /* sizing up fifo */
            fifo_depth <<= 1;
            mem_tmp = new (TYPE OF OUTPUT SIGNAL)[fifo_depth];
            mem_tmp = (TYPE OF OUTPUT SIGNAL*) memmove(mem_tmp, mem, sizeof(TYPE OF OUTPUT SIGNAL)*fifo_depth);
            delete [] mem;
            mem = new (TYPE OF OUTPUT SIGNAL)[fifo_depth];
            mem = (TYPE OF OUTPUT SIGNAL*) memmove(mem, mem_tmp, sizeof(TYPE OF OUTPUT SIGNAL)*fifo_depth);
            delete [] mem_tmp;
            clk_mem_tmp = new (unsigned long long int)[fifo_depth];
            clk_mem_tmp = (unsigned long long int *) memmove(clk_mem_tmp, clk_mem, sizeof(unsigned long long int)*fifo_depth);
            delete [] clk_mem;
            clk_mem = new (unsigned long long int)[fifo_depth];
            clk_mem = (unsigned long long int *) memmove(clk_mem, clk_mem_tmp, sizeof(unsigned long long int)*fifo_depth);
            delete [] clk_mem_tmp;
        }
        w_ptr++;
        init_flg = 1;
    }
}
```

```
pre_out = OUTPUT SIGNAL NAME.read();
if(empty == 0 && Orig OUTPUT SIGNAL NAME Read.read() == 1) {
/* read operation */
  Orig OUTPUT SIGNAL NAME .write(mem[r_ptr]);
  Orig OUTPUT SIGNAL NAME Clk.write(clk_mem[r_ptr]);
  r_ptr++;
  data_cnt--;
}
if(data_cnt == 0) {
  empty = 1;
} else {
  empty = 0;
}
Orig OUTPUT SIGNAL NAME Empty.write(empty);

/* Clock count up */
if(write_cond.read())ClkCnt++;
  wait();
 }
}
```

FIG. 33

MODEL DESCRIPTION OF OPERATION DESCRIPTION FOR CONDITIONED INCREASE IN SIZE OF SAMPLE MODEL OUTPUT FIFO

```
#include "OrigFifo OUTPUT SIGNAL NAME .h"
void OrigFifo OUTPUT SIGNAL NAME::flfo()
{
  static bool               wrap;
  static TYPE OF OUTPUT SIGNAL    pre_out;
  static bool               empty;
  static unsigned long long int  r_ptr;
  static unsigned long long int  w_ptr;
  static unsigned long long int  fifo_depth;
  static unsigned long long int  fifo_depth_shadow;
  static unsigned long long int  fifo_div;
  static TYPE OF OUTPUT SIGNAL    *mem;
  static TYPE OF OUTPUT SIGNAL    *mem_tmp;
  static unsigned long long int  *clk_mem;
  static unsigned long long int  *clk_mem_tmp;
  static unsigned long long int  data_cnt;
  static unsigned long long int  empty_th;
  static unsigned long long int  half_th;
  static unsigned long long int  full_th;
  static bool               init_flg = 0;
  static unsigned long long int  ClkCnt = 0;
  wrap = 0;
  fifo_depth = VALUE DETERMINED BY OUTPUT FIFO STAGE NUMBER DETERMINATION MEANS;
  fifo_div = INPUT VALUE N TO OUTPUT FIFO STAGE NUMBER DETERMINATION MEANS;
  mem = new (TYPE OF OUTPUT SIGNAL)[fifo_depth];
  clk_mem = new (unsigned long long int)[fifo_depth];
  empty = 0;
  r_ptr = 0;
  w_ptr = 0;
  data_cnt = 0;
  fifo_depth_shadow = fifo_depth;
  empty_th = fifo_depth/fifo_div;
  full_th  = (fifo_depth*(fifo_div-1))/fifo_div;
  half_th  = fifo_depth>>1;
  pre_out = 0;
  Orig OUTPUT SIGNAL NAME Empty.write(1);
  init_flg = 0;
  ClkCnt = 0;
  wait();
```

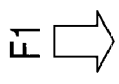

```
while (1) {
  if(init_flg == 0 || pre_out != OUTPUT SIGNAL NAME.read()) {
    /* write operation */
    mem[w_ptr] = OUTPUT SIGNAL NAME.read();
    clk_mem[w_ptr] = ClkCnt;
    data_cnt++;
    if(w_ptr == fifo_depth - 1) {
      if(w_ptr - r_ptr >= THRESHOLD VALUE OR THRESHOLD VARIABLE SPECIFIED BY INCREASE IN FIFO STAGE NUMBER) {
        /* sizing up fifo */
        fifo_depth <<= 1;
        fifo_div <<= 1;
        mem_tmp = new (TYPE OF OUTPUT SIGNAL)[fifo_depth];
          mem_tmp = (TYPE OF OUTPUT SIGNAL*)memmove(mem_tmp, mem, sizeof(TYPE OF OUTPUT SIGNAL)*fifo_depth);
          delete [] mem;
        mem = new (TYPE OF OUTPUT SIGNAL)[fifo_depth];
          mem = (TYPE OF OUTPUT SIGNAL*)memmove(mem, mem_tmp, sizeof(TYPE OF OUTPUT SIGNAL)*fifo_depth);
          delete [] mem_tmp;
        clk_mem_tmp = new (unsigned long long int)[fifo_depth];
          clk_mem_tmp = (unsigned long long int *) memmove(clk_mem_tmp, clk_mem, sizeof(unsigned long long int)*fifo_depth);
          delete [] mem;
        clk_mem = new (unsigned long long int)[fifo_depth];
          clk_mem = (unsigned long long int *) memmove(clk_mem, clk_mem_tmp, sizeof(unsigned long long int)*fifo_depth);
          delete [] clk_mem_tmp;
      }
      w_ptr++;
    } else {
      fifo_depth_shadow = fifo_depth;
      w_ptr = 0;
      wrap = 1;
    }
  } else {
    w_ptr++;
  }
  init_flg = 1;
}
pre_out = OUTPUT SIGNAL NAME.read();
```

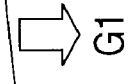

```
if(empty == 0 && OrigOUTPUT SIGNAL NAME Read.read() == 1) {
/* read operation */
  Orig OUTPUT SIGNAL NAME .write(mem[r_ptr]);
  Orig OUTPUT SIGNAL NAME Clk.write(clk_mem[r_ptr]);
  if(wrap == 1) {
    if(r_ptr == fifo_depth_shadow - 1) {
      wrap = 0;
      r_ptr = 0;
    } else {
      r_ptr++;
    }
  } else {
    if(r_ptr == fifo_depth - 1) {
      r_ptr = 0;
    } else {
      r_ptr++;
    }
  }
  data_cnt--;
}
if(data_cnt == 0) {
  empty = 1;
} else {
  empty = 0;
}
Orig OUTPUT SIGNAL NAME Empty.write(empty);

/* threshold definition and updata */
empty_th = (fifo_depth*1)/fifo_div;
full_th  = (fifo_depth*(fifo_div-1))/fifo_div;
half_th  = fifo_depth>>1;

/* Clock count up */
if(write_cond.read()) ClkCnt++;
  wait();
 }
}
```

FIG. 37

MODEL DESCRIPTION OF HEADER FILE OF MODEL TO BE VERIFIED OUTPUT FIFO

```
SC_MODULE( TgtFifo OUTPUT SIGNAL NAME ) {
  sc_in_clk clk;
  sc_in < bool > rst;
  sc_in < bool > write_cond;
  sc_in < bool > Tgt OUTPUT SIGNAL NAME Read;
  sc_in < TYPE OF OUTPUT SIGNAL > OUTPUT SIGNAL NAME;
  sc_out < bool > Tgt OUTPUT SIGNAL NAME Empty;
  sc_out < TYPE OF OUTPUT SIGNAL > Tgt OUTPUT SIGNAL NAME;
  sc_out < unsigned long long int > Tgt OUTPUT SIGNAL NAME Clk;

void fifo();

SC_CTOR(TgtFifo OUTPUT SIGNAL NAME) {
    SC_CTHREAD( fifo, clk.pos() );
    reset_signal_is( rst, false );

}
};
```

GENERATION OF OPERATION DESCRIPTION FILE OF MODEL TO BE VERIFIED OUTPUT FIFO

FIG. 39

MODEL DESCRIPTION OF OPERATION DESCRIPTION FOR UNCONDITIONED INCREASE IN SIZE OF MODEL TO BE VERIFIED OUTPUT FIFO

```
#include "TgtFifo OUTPUT SIGNAL NAME .h"
void TgtFifo OUTPUT SIGNAL NAME::fifo()
{
  static bool              wrap;
  static TYPE OF OUTPUT SIGNAL    pre_out;
  static bool              pre_start;
  static bool              start_flg;
  static bool              empty;
  static unsigned long long int  r_ptr;
  static unsigned long long int  w_ptr;
  static unsigned long long int  fifo_depth;
  static TYPE OF OUTPUT SIGNAL    *mem;
  static TYPE OF OUTPUT SIGNAL    *mem_tmp;
  static unsigned long long int  *clk_mem;
  static unsigned long long int  *clk_mem_tmp;
  static unsigned long long int  data_cnt;
  static bool init_flg = 0;
  static unsigned long long int  ClkCnt = 0;
  wrap = 0;
  fifo_depth =VALUE DETERMINED BY OUTPUT FIFO STAGE NUMBER DETERMINATION MEANS;
  mem = new (TYPE OF OUTPUT SIGNAL) [fifo_depth];
  clk_mem = new (unsigned long long int)[fifo_depth];
  empty = 0;
  pre_start = 0;
  r_ptr = 0;
  w_ptr = 0;
  data_cnt = 0;
  pre_out = 0;
  Tgt OUTPUT SIGNAL NAME Empty.write(1);
  init_flg = 0;
  start_flg = 0;
  ClkCnt = 0;
  wait();
```

```
while (1) {
    if(pre_start == 0 && start.read() == 1) {
        start_flg = 1;
    }
    pre_start = start.read();
    if(start_flg == 1) {
        if(init_flg == 0 || pre_out != OUTPUT SIGNAL NAME.read()) {
            /* write operation */
            mem[w_ptr] = OUTPUT SIGNAL NAME.read();
            clk_mem[w_ptr] = ClkCnt;
            data_cnt++;
            if(w_ptr == fifo_depth - 1) {
                /* sizing up fifo */
                fifo_depth <<= 1;
                fifo_div <<= 1;
                mem_tmp = new (TYPE OF OUTPUT SIGNAL)[fifo_depth];
                mem_tmp = (TYPE OF OUTPUT SIGNAL*)memmove(mem_tmp, mem, sizeof(TYPE OF OUTPUT SIGNAL)*fifo_depth);
                delete [] mem;
                mem = new (TYPE OF OUTPUT SIGNAL)[fifo_depth];
                mem = (TYPE OF OUTPUT SIGNAL*)memmove(mem, mem_tmp, sizeof(TYPE OF OUTPUT SIGNAL)*fifo_depth);
                delete [] mem_tmp;
                clk_mem_tmp = new (unsigned long long int)[fifo_depth];
                clk_mem_tmp = (unsigned long long int *) memmove(clk_mem_tmp, clk_mem, sizeof(unsigned long long int)*fifo_depth);
                delete [] mem;
                clk_mem = new (unsigned long long int)[fifo_depth];
                clk_mem = (unsigned long long int *) memmove(clk_mem, clk_mem_tmp, sizeof(unsigned long long int)*fifo_depth);
                delete [] clk_mem_tmp;
            }
            w_ptr++;
            init_flg = 1;
        }
```

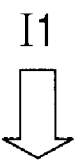

I1

```
pre_out = OUTPUT SIGNAL NAME.read();
if(empty == 0 && Tgt OUTPUT SIGNAL NAME Read.read() == 1) {
/* read operation */
  Tgt OUTPUT SIGNAL NAME.write(mem[r_ptr]);
  Tgt OUTPUT SIGNAL NAME Clk.write(clk_mem[r_ptr]);
  r_ptr++;
  data_cnt--;
}
if(data_cnt == 0) {
  empty = 1;
} else {
  empty = 0;
}
Tgt OUTPUT SIGNAL NAME Empty.write(empty);
} else {
  Tgt OUTPUT SIGNAL NAME Empty.write(1);
}
if(start_flg == 1) {
  if(read_cond.read())ClkCnt++;
}
wait();
 }
}
```

FIG. 42

MODEL DESCRIPTION OF OPERATION DESCRIPTION FOR CONDITIONED INCREASE IN SIZE OF MODEL TO BE VERIFIED OUTPUT FIFO

```
#include "TgtFifoOUTPUT SIGNAL NAME.h"
void TgtFifoOUTPUT SIGNAL NAME::fifo()
{
  static bool              wrap;
  static TYPE OF OUTPUT SIGNAL    pre_out;
  static bool              pre_start;
  static bool              start_flg;
  static bool              empty;
  static unsigned long long int r_ptr;
  static unsigned long long int w_ptr;
  static unsigned long long int fifo_depth;
  static unsigned long long int fifo_depth_shadow;
  static unsigned long long int fifo_div;
  static TYPE OF OUTPUT SIGNAL    *mem;
  static TYPE OF OUTPUT SIGNAL    *mem_tmp;
  static unsigned long long int *clk_mem;
  static unsigned long long int *clk_mem_tmp;
  static unsigned long long int data_cnt;
  static unsigned long long int empty_th;
  static unsigned long long int half_th;
  static unsigned long long int full_th;
  static bool init_flg = 0;
  static unsigned long long int ClkCnt = 0;
  wrap = 0;
  fifo_depth = VALUE DETERMINED BY OUTPUT FIFO STAGE NUMBER DETERMINATION MEANS;
  fifo_div = INPUT VALUE N TO OUTPUT FIFO STAGE NUMBER DETERMINATION MEANS;
  mem = new TYPE OF OUTPUT SIGNAL [fifo_depth];
  clk_mem = new (unsigned long long int)[fifo_depth];
  empty = 0;
  pre_start = 0;
  r_ptr = 0;
  w_ptr = 0;
  data_cnt = 0;
  fifo_depth_shadow = fifo_depth;
  empty_th = fifo_depth/fifo_div;
  full_th  = (fifo_depth*(fifo_div-1))/fifo_div;
  half_th  = fifo_depth>>1;
  pre_out = 0;
  TgtOUTPUT SIGNAL NAME Empty.write(1);
  init_flg = 0;
  start_flg = 0;
  ClkCnt = 0;
  wait();
```

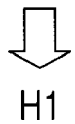

```
while (1) {
    if(pre_start == 0 && start.read() == 1) {
        start_flg = 1;
    }
    pre_start = start.read();
    if(start_flg == 1) {
        if(init_flg == 0 || pre_out != OUTPUT SIGNAL NAME.read()) {
            /* write operation */
            mem[w_ptr] = OUTPUT SIGNAL NAME.read();
            clk_mem[w_ptr] = ClkCnt;
            data_cnt++;
            if(w_ptr == fifo_depth - 1) {
                if(w_ptr - r_ptr >= THRESHOLD VALUE OR THRESHOLD VARIABLE SPECIFIED BY INCREASE IN FIFO STAGE NUMBER) {
                    /* sizing up fifo */
                    fifo_depth <<= 1;
                    fifo_div <<= 1;
                    mem_tmp = new (TYPE OF OUTPUT SIGNAL)[fifo_depth];
                    mem_tmp = (TYPE OF OUTPUT SIGNAL*) memmove(mem_tmp, mem, sizeof(TYPE OF OUTPUT SIGNAL)*fifo_depth);
                    delete [] mem;
                    mem = new (TYPE OF OUTPUT SIGNAL)[fifo_depth];
                    mem = (TYPE OF OUTPUT SIGNAL*) memmove(mem, mem_tmp, sizeof(TYPE OF OUTPUT SIGNAL)*fifo_depth);
                    delete [] mem_tmp;
                    clk_mem_tmp = new (unsigned long long int)[fifo_depth];
                    clk_mem_tmp = (unsigned long long int *) memmove(clk_mem_tmp, clk_mem, sizeof(unsigned long long int)*fifo_depth);
                    delete [] mem;
                    clk_mem = new (unsigned long long int)[fifo_depth];
                    clk_mem = (unsigned long long int *) memmove(clk_mem, clk_mem_tmp, sizeof(unsigned long long int)*fifo_depth);
                    delete [] clk_mem_tmp;
                    w_ptr++;
                } else {
                    fifo_depth_shadow = fifo_depth;
                    w_ptr = 0;
                    wrap = 1;
                }
            } else {
                w_ptr++;
            }
            init_flg = 1;
        }
```

K1

```
pre_out = OUTPUT SIGNAL NAME.read();
if(empty == 0 && TgtOUTPUT SIGNAL NAME Read.read() == 1) {
/* read operation */
  TgtOUTPUT SIGNAL NAME.write(mem[r_ptr]);
  TgtOUTPUT SIGNAL NAMEClk.write(clk_mem[r_ptr]);
  if(wrap == 1) {
    if(r_ptr == fifo_depth_shadow - 1) {
      wrap = 0;
      r_ptr = 0;
    } else {
      r_ptr++;
    }
  } else {
    if(r_ptr == fifo_depth - 1) {
      r_ptr = 0;
    } else {
      r_ptr++;
    }
  }
  data_cnt--;
}
if(data_cnt == 0) {
  empty = 1;
} else {
  empty = 0;
}
TgtOUTPUT SIGNAL NAME Empty.write(empty);
} else {
  TgtOUTPUT SIGNAL NAME Empty.write(1);
}
if(start_flg == 1) {
  if(read_cond.read())ClkCnt++;
}

/* threshold definition and updata */
empty_th = (fifo_depth*1)/fifo_div;
full_th  = (fifo_depth*(fifo_div-1))/fifo_div;
half_th  = fifo_depth>>1;
wait();
  }
}
```

FIG. 46

MODEL DESCRIPTION OF HEADER FILE OF OUTPUT SIGNAL VALUE
COINCIDENCE JUDGMENT MODEL OF OUTPUT FIFO PAIR

```
SC_MODULE( Comp OUTPUT SIGNAL NAME
  sc_in < bool > Orig OUTPUT SIGNAL NAME Empty;
  sc_in < bool > Tgt OUTPUT SIGNAL NAME Empty;
  sc_in < TYPE OF OUTPUT SIGNAL > Orig OUTPUT SIGNAL NAME;
  sc_in < TYPE OF OUTPUT SIGNAL > Tgt OUTPUT SIGNAL NAME;
  sc_in < unsigned long long int > Orig OUTPUT SIGNAL NAME Clk;
  sc_in < unsigned long long int > Tgt OUTPUT SIGNAL NAME Clk;
  sc_out < bool > Orig OUTPUT SIGNAL NAME Read;
  sc_out < bool > Tgt OUTPUT SIGNAL NAME Read;
  sc_out < bool > Compare OUTPUT SIGNAL NAME;

void compare();

SC_CTOR( Comp OUTPUT SIGNAL NAME) {
    SC_METHOD( compare );
      sensitive << Orig OUTPUT SIGNAL NAME Empty;
      sensitive << Tgt OUTPUT SIGNAL NAME Empty;
      sensitive << Orig OUTPUT SIGNAL NAME;
      sensitive << Tgt OUTPUT SIGNAL NAME;

MODEL DESCRIPTION OF OPERATION DESCRIPTION OF OUTPUT SIGNAL VALUE COINCIDENCE JUDGMENT MODEL OF OUTPUT FIFO PAIR

```
#inlcude "Comp OUTPUT SIGNAL NAME.h"
void Comp OUTPUT SIGNAL NAME::compare() {
  if(Orig OUTPUT SIGNAL NAME Empty.read()==0 && Tgt OUTPUT SIGNAL NAME Empty.read()==0) {
    Orig OUTPUT SIGNAL NAME Read.write(1);
    Tgt OUTPUT SIGNAL NAME Read.write(1);
  } else {
    Orig OUTPUT SIGNAL NAME Read.write(0);
    Tgt OUTPUT SIGNAL NAME Read.write(0);
  }
  if(Orig OUTPUT SIGNAL NAME.read() == Orig OUTPUT SIGNAL NAME.read()) {
    Compare OUTPUT SIGNAL NAME.write(1);
#ifdef DEBUG
    cout << "OK: Original OUTPUT SIGNAL NAME = " << Orig OUTPUT SIGNAL NAME.read() << "(" << Orig OUTPUT SIGNAL NAME Clk.read() << ")";
    cout << " Target OUTPUT SIGNAL NAME = " << Tgt OUTPUT SIGNAL NAME.read() << "(" << Tgt OUTPUT SIGNAL NAME Clk.read() << ")" << endl;
#endif
  } else {
    Compare OUTPUT SIGNAL NAME.write(0);
#ifdef DEBUG
    cout << "NG: Original OUTPUT SIGNAL NAME = " << Orig OUTPUT SIGNAL NAME.read() << "(" << Orig OUTPUT SIGNAL NAME Clk.read() << ")";
    cout << " Target OUTPUT SIGNAL NAME = " << Tgt OUTPUT SIGNAL NAME.read() << "(" << Tgt OUTPUT SIGNAL NAME Clk.read() << ")" << endl;
#endif
  }
}
```

FIG. 50

HEADER FILE DESCRIPTION OF CLOCK TERMINATION CONTROLLER

```
SC_MODULE( Control ) {
  sc_in < bool > clk;
  sc_in < bool > rst;
  sc_in < bool > in_kerochanStart;
  sc_in < bool > in_kerochanEmpty;
  sc_in < bool > in_kerochanFull;
  sc_in < bool > in_kerochanEmptyAlart;
  sc_in < bool > in_kerochanFullAlart;
  sc_in < bool > in_yueStart;
  sc_in < bool > in_yueEmpty;
  sc_in < bool > in_yueFull;
  sc_in < bool > in_yueEmptyAlart;
  sc_in < bool > in_yueFullAlart;
  sc_in < bool > in_sakuraStart;
  sc_in < bool > in_sakuraEmpty;
  sc_in < bool > in_sakuraFull;
  sc_in < bool > in_sakuraEmptyAlart;
  sc_in < bool > in_sakuraFullAlart;
  sc_in < bool > in_woodStart;
  sc_in < bool > in_woodEmpty;
  sc_in < bool > in_woodFull;
  sc_in < bool > in_woodEmptyAlart;
  sc_in < bool > in_woodFullAlart;
  sc_in < bool > in_flyStart;
  sc_in < bool > in_flyEmpty;
  sc_in < bool > in_flyFull;
  sc_in < bool > in_flyEmptyAlart;
  sc_in < bool > in_flyFullAlart;
  sc_out < bool > PostClk;
  sc_out < bool > PostClk2;
  sc_out < bool > PreClk;
  sc_out < bool > start;
  sc_out < bool > read_cond;
  sc_out < bool > write_cond;
  sc_signal < bool > read_cond2;
  bool tmp_read_cond;
  bool tmp_start
  bool empty;
  bool full;
  bool empty_alart;
  bool FullAlart;
  bool read_cond;

void ctrl();
  void FF();

SC_CTOR( ctrl ) {
    SC_METHOD( th_Control );
    sensitive << clk;
    sensitive << in_kerochanStart;
    sensitive << in_yueStart;
    sensitive << in_sakuraStart;
    sensitive << in_woodStart;
    sensitive << in_flyStart;
    sensitive << in_kerochanEmptyAlart;
    sensitive << in_yueEmptyAlart;
    sensitive << in_sakuraEmptyAlart;
    sensitive << in_woodEmptyAlart;
    sensitive << in_flyEmptyAlart;
    sensitive << in_kerochanEmpty;
    sensitive << in_yueEmpty;
    sensitive << in_sakuraEmpty;
    sensitive << in_woodEmpty;
    sensitive << in_flyEmpty;
    sensitive << read_cond2;
    sensitive << in_kerochanFullAlart;
    sensitive << in_yueFullAlart;
    sensitive << in_sakuraFullAlart;
    sensitive << in_woodFullAlart;
    sensitive << in_flyFullAlart;
    sensitive << in_kerochanFull;
    sensitive << in_yueFull;
    sensitive << in_sakuraFull;
    sensitive << in_woodFull;
    sensitive << in_flyFull;

SC_CTHREAD( FF, clk.pos() );
    reset_signal_is(rst, false);
  }
};
```

FIG. 51

OPERATION DESCRIPTION OF CLOCK TERMINATION CONTROLLER

```
#include "Control.h"

void Control::ctrl() {
    tmp_start = in_kerochanStart.read()&&in_yueStart.read()&&in_sakuraStart.read()&&in_woodStart.read()&&in_flyStart.read();
    start.write(tmp_start);

full_alart = in_kerochanFullAlart.read()||in_yueFullAlart.read()||in_sakuraFullAlart.read()||in_woodFullAlart.read()||in_flyFullAlart.read();
    full = ~in_kerochanFull.read()||~in_yueFull.read()||~in_sakuraFull.read()||~in_woodFull.read()||~in_flyFull.read();
    PreClk.write((full&&~full_alart||tmp_start)&&clk.read());
    write_cond.write(full&&~full_alart||tmp_start);

empty_alart = in_kerochanEmptyAlart.read()||in_yueEmptyAlart.read()||in_sakuraEmptyAlart.read()||in_woodEmptyAlart.read()||in_flyEmptyAlart.read();
    empty = ~in_kerochanEmpty.read()||~in_yueEmpty.read()||~in_sakuraEmpty.read()||~in_woodEmpty.read()||~in_flyEmpty.read();
    tmp_read_cond = empty&&~empty_alart&&tmp_start;
    PostClk.write(tmp_read_cond&&clk.read());
    read_cond.write(tmp_read_cond);
    PostClk2.write(read_cond2.read()&&clk.read());
} void Control::FF() {
    unsigned char read_cond2;
    read_cond2.write(0);
    while(1) {
        wait();
        read_cond2.write(read_cond.read());
    }
}
```

EQUIVALENCE CHECKING METHOD, EQUIVALENCE CHECKING PROGRAM, AND GENERATING METHOD FOR EQUIVALENCE CHECKING PROGRAM

CROSS-REFERENCE TO RELATED APPLICATION

The present application claims priority from Japanese patent application No. 2008-74859 filed on Mar. 24, 2008, the content of which is hereby incorporated by reference into this application.

BACKGROUND OF THE INVENTION

The present invention relates to a technique to generate a checking environment for a new circuit developed while maintaining the equivalence of a flow (functions or behaviors of the circuit), and for example, relates to a technique which is effective when applied for the generation of a test environment of a semiconductor integrated circuit extended in function while maintaining the flow equivalence, and the test using the test environment.

Patent document 1 (Japanese patent laid-open No. 2005-316595) describes an invention which relates to a technique to judge, in a simulation, the equivalence between a circuit description of operation level described in a system level design language and an RTL (Register Transfer Level) circuit description described in an HDL (Hardware Description Language). In this technique, equivalence judgment is carried out by carrying out simulations individually for the respective circuit descriptions and judging whether the order of waveforms in signal value transition is maintained after acquiring information about signal waveforms. Consequently, individual test benches (programs for generating a test pattern to test a circuit description) are configured for the respective circuit descriptions, and therefore, it is not possible to realize equivalence judgment using an identical test bench.

Patent document 2 (Japanese patent laid-open No. 2003-141202) describes an invention, which has been developed for the purpose of checking whether the modification/operation is carried out correctly in each internal process by focusing attention on the internal process stage in operation composition, wherein equivalence judgment before and after the composition is carried out. In this technique, whether the modification of description is carried out correctly in each deformation process of an input description carried out by an operation composition tool is proved by directly accessing an intermediate representation generated by the operation composition tool in each deformation process. An equivalence checking is carried out by extracting respective EFSMs (Extended Finite State Machines) from the intermediate representations before and after the deformation process, finding next state functions and output functions of the respective EFSMs in a symbolic simulation, and checking whether the obtained next state functions and output functions are equal to each other. That is, the technique described in patent document 2 is not an equivalence checking technique by a simulation using a test bench.

Patent document 3 (Japanese patent laid-open No. 2004-145712) describes an invention, which has been developed for the purpose of making it possible to carry out equivalence checking by comparing an input description to operation composition and resultant waveforms of a simulation of an output result RTL, wherein the equivalence judgment before and after the composition is carried out. In this invention, the equivalence checking of the input description and the output description is carried out by simulating the input description to the operation composition and the output result RTL individually, identifying the correspondence of transaction in each output waveform using information of cycle specification assigned to the input description or cycle information inserted by the operation composition, and comparing the output waveforms in units of transactions. Consequently, a description of a test bench is required for each of the input description and the output result RTL.

SUMMARY OF THE INVENTION

The inventor of the present invention has studied on the utilization of a test bench to realize a test environment for a circuit model that will serve as a fundamental for the equivalence checking of a circuit to be newly developed for the fundamental circuit model. It is not proper to utilize a test bench for the above-mentioned patent documents 1 to 3 in such a meaning. As described above, the technique in patent document 1 cannot realize equivalence judgment using the same test bench for the respective circuit descriptions of the circuit description of the operation level described in the system level design language and the RTL circuit description described in the HDL. The technique in patent document 2 is not an equivalence checking technique by a simulation using a test bench right from the start. The technique in patent document 3 requires the description of a test bench for the input description and the output result RTL, respectively.

The inventor of the present invention has focused attention on the fact that the problem that the utilization of a test bench before and after a composition cannot be simply done results from the difference between the input/output access timing cycle of the composition input description and the input/output access timing cycle of the composition result due to the scheduling of the operation composition. Since the input/output access timing cycle differs between before and after the composition, it is not possible to utilize the test bench used for the composition input description unless as is. It is expected that the number of processes will increase considerably if the composition result is analyzed and then modification is made manually so that the test bench be connectable.

An object of the present invention is to provide a checking method that utilizes a test bench for a circuit model that will serve as a fundamental for the equivalence checking of a circuit to be newly developed for the fundamental circuit model.

Another object of the present invention is to provide a program that generates a checking environment to make it possible to carry out the equivalence checking for an RTL description model obtained by using an operation composition tool, a simulation model, etc., by utilizing an already existing test bench.

Yet another object of the present invention is to provide a method for generating a checking environment to make it possible to carry out the equivalence checking for an RTL description model obtained by using an operation composition tool, a simulation model, etc., by utilizing an already existing test bench.

The above and further objects and novel features of the invention will more fully appear from the following detailed description in this specification and the accompanying drawings.

Representative invention among the inventions disclosed herein is briefly outlined below.

That is, in order to check the equivalence of a model to be verified using a sample model the circuit of which has been described in a predetermined language and a test vector generation model for the sample model, a process for writing an output from the sample model test vector generation model into an input FIFO group for each signal of the sample model with the same timing as that of the sample model while the sample model is inputting/outputting a signal from/to the sample model test vector generation model with cycle accuracy and a process for reading data from the input FIFO group with the same operation timing as that of the model to be verified and outputting the data to the model to be verified are carried out, and then an output of the sample model and an output of the model to be verified are written into an output FIFO pair group for each corresponding signal name and coincidence judgment is carried out for a pair output for each written signal name.

Thereby, the difference between the input/output access timing cycle between the sample model and a test vector generation model, which is a test bench of the sample model, and the input/output access timing cycle between the model to be verified and the test vector generation model is eliminated by the input FIFO group and the output FIFO pair group. As a result, it is made possible to utilize a test bench of a sample model for the equivalence assessment of a model to be verified.

The effect brought about by a representative invention among the inventions disclosed herein will be briefly described as follows.

That is, it is made possible to utilize a test bench for a circuit model that will serve as a fundamental for the equivalence checking of a circuit to be developed newly for the fundamental circuit model.

BRIEF DESCRIPTION OF THE DRAWINGS

FIG. 7 is an explanatory diagram illustrating a module name/port declaration description part of a sample model and the transformation result according to a procedure in FIG. 5.

FIG. 8 is an explanatory diagram illustrating a module name/port declaration description part of a model to be verified and the transformation result according to a procedure in FIG. 6.

FIG. 9 is an explanatory diagram conceptually showing a common process for both the sample model and the function checking model for the modification of operation description.

FIG. 10 is a flowchart illustrating a process to carry out the transformation from the operation description of a sample model to that of a sample model test input fetch model, including a transformation process shown in FIG. 9.

FIG. 11 is an explanatory diagram illustrating a correspondence table used when determining a type of a local variable within a function.

FIG. 15 is an explanatory diagram illustrating an operation description part of a model to be verified and a transformation result in a process in FIG. 13.

FIG. 17 is an explanatory diagram illustrating a transformation result in the modification process in FIG. 16.

FIG. 18 is a flowchart illustrating details of an FIFO parameter setting and FIFO description generation process S12.

FIG. 21 is an explanatory diagram illustrating part of an input FIFO description generated when there is not threshold value setting of size up.

FIG. 22 is an explanatory diagram illustrating an input FIFO description that follows FIG. 21.

FIG. 23 is an explanatory diagram illustrating part of an input FIFO description generated when there is a threshold value setting of size up.

FIG. 24 is an explanatory diagram illustrating an input FIFO description that follows FIG. 23.

FIG. 25 is an explanatory diagram illustrating an input FIFO description that follows FIG. 24.

FIG. 27 is a flowchart illustrating a generation process of a header file of sample model output FIFO.

FIG. 28 is an explanatory diagram illustrating a model description of a header file of a sample model output FIFO.

FIG. 30 is an explanatory diagram illustrating a model description of an operation description for unconditioned size up of a sample model output FIFO.

FIG. 31 is an explanatory diagram illustrating a model description that follows FIG. 30.

FIG. 32 is an explanatory diagram illustrating a model description that follows FIG. 31.

FIG. 33 is an explanatory diagram illustrating a model description of an operation description for conditioned size up of a sample model output FIFO.

FIG. 34 is an explanatory diagram illustrating a model description that follows FIG. 33.

FIG. 35 is an explanatory diagram illustrating a model description that follows FIG. 34.

FIG. 37 is an explanatory diagram illustrating a header file model description of a model to be verified output FIFO.

FIG. 39 is an explanatory diagram illustrating a model description of an operation description for conditioned size up of a model to be verified output FIFO.

FIG. 40 is an explanatory diagram illustrating a model description that follows FIG. 39.

FIG. 41 is an explanatory diagram illustrating a model description that follows FIG. 40.

FIG. 42 to FIG. 44 are explanatory diagrams illustrating a model description of an operation description for conditioned size up of a model to be verified output FIFO.

FIG. 43 is an explanatory diagram illustrating a model description that follows FIG. 42.

FIG. 44 is an explanatory diagram illustrating a model description that follows FIG. 43.

FIG. 46 is an explanatory diagram illustrating a header file model description of an output signal value coincidence judgment model of an output FIFO pair.

FIG. 48 is an explanatory diagram illustrating a model description of an operation description of an output signal value coincidence judgment model of an output FIFO pair.

FIG. 50 is an explanatory diagram illustrating a header file description of a clock termination controller.

FIG. 51 is an explanatory diagram illustrating an operation description of a clock termination controller.

DETAILED DESCRIPTION OF THE PREFERRED EMBODIMENTS

1. Outline of Embodiments

Figure 1:
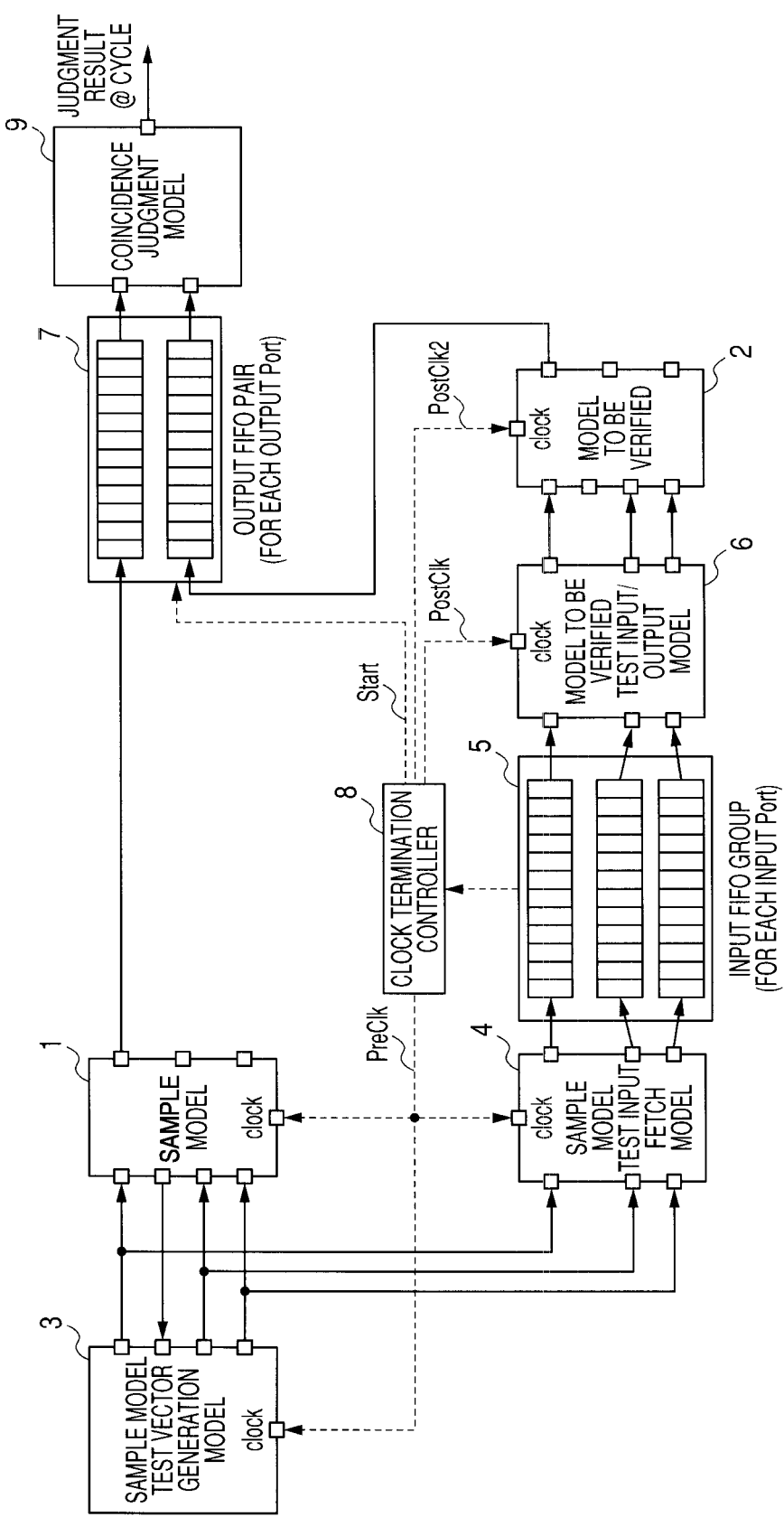
FIG. 1 is an explanatory diagram illustrating a configuration of a virtual test environment generated by a test environment generation method of the present invention.

First, the outline of a typical embodiment of the invention disclosed in the application will be described. In the description of the outline of a typical embodiment, reference symbols and numerals in the drawings to be referred to with parentheses attached only illustrate those included in the concept of the components to which the reference symbols and numerals are attached.

An equivalence checking method according to one specific aspect of the present invention is a method of checking the equivalence of a model to be verified using a sample model the circuit of which has been described in a predetermined language and a test vector generation model for the sample model and the method includes first to fifth processes as processes to be executed by a computer, respectively. The first process is a process in which the sample model inputs/outputs a signal from/to the sample model test vector generation model with cycle accuracy. The second process is a process for controlling writing an output from the sample model test vector generation model into an input FIFO group for each signal of the sample model with the same timing as that of the sample model. The third process is a process for reading data from the input FIFO group with the same operation timing as that of the model to be verified and outputting the data to the model to be verified. The fourth process is a process for writing an output of the sample model and an output of the model to be verified into an output FIFO pair group for each corresponding signal name. The fifth process is a process for carrying out coincidence judgment for a pair output for each signal name of the output FIFO pair group.

Thereby, the difference between the input/output access timing cycle between the sample model and a test vector generation model, which is a test bench thereof, and the input/output access timing cycle between the model to be verified and the test vector generation model is eliminated by the second to fourth processes using the input FIFO group and the output FIFO pair group. As a result, it is made possible to utilize a test bench of a sample model for the equivalence assessment of a model to be verified.

[2] In the equivalence checking method in paragraph 1, for example, the execution of the first process and second process is terminated when all of input FIFOs in the input FIFO group come to hold data the number of pieces of which is not less than a number specified by a first input FIFO threshold value (D(port)/2, D(port)×(N−1)/N, D(port)/N, or a value selected from among arbitrarily specified positive numbers) or when at least one of the input FIFOs becomes full and those processes are executed in the other states. Since the execution of the first and second processes is terminated when all of the input FIFOs come to hold data the number of pieces of which is not less than a number specified by the first input FIFO threshold value, it is possible to alleviate the state in which the individual input FIFOs become full both randomly and frequently and thus the checking process efficiency can be improved.

[3] In the equivalence checking method in paragraph 1, for example, the execution of the third process and fourth process is started when all of the input FIFOs in the input FIFO group come to hold data the number of pieces of which is a predetermined number or more. This is to make an attempt to improve the efficiency of the checking process by eliminating in advance the difference in the input/output access timing cycle between the sample model and the model to be verified before the processes start.

[4] In the equivalence checking method in paragraph 3, the third process and fourth process the execution of which has been started are terminated when all of the input FIFOs in the input FIFO group come to hold data the number of pieces of which is not more than a number specified by a second input FIFO threshold value (D(port)/2, D(port)×(N−1)/N, D(port)/N, or a value selected from among arbitrarily specified positive numbers) or when at least one of the input FIFOs becomes empty and those processes are executed in the other states. It is therefore possible to alleviate the state in which the individual input FIFOs become empty both randomly and frequently and thus the checking process efficiency can be improved.

[5] The equivalence checking method in paragraph 1 further includes an upsizing process, as a process to be executed by a computer, to increase the number of FIFO stages each time the number of pieces of data held by the input FIFO reaches a predetermined number. Since the number of FIFO stages can be increased dynamically in correspondence with a signal that is input and output frequently, it is possible to reduce the possibility that a specific FIFO becomes full and thus the checking process efficiency can be improved.

[6] In the equivalence checking method in paragraph 5, that the number of pieces of data held by the input FIFO reaches a predetermined number means, for example, that the difference between the value of a write pointer of the input FIFO and that of a read pointer becomes a third input FIFO threshold value (D(port)/2, D(port)×(N−1)/N, D(port)/N, or a value selected from among arbitrarily specified positive numbers)

or more. It is possible to control whether or not to accept size up in accordance with the difference in the operation speed between writing and reading into/from the input FIFO.

[7] In the equivalence checking method in paragraph 6, for example, the third input FIFO threshold value is a number increased in accordance with a variable (N) to be increased for each of the upsizing processes. It is made easier to properly control whether or not to accept the next upsizing after once upsized.

[8] The equivalence checking method in paragraph 1 further includes an upsizing process, as a process to be executed by a computer, to increase the number of FIFO stages each time the number of pieces of data held by the output FIFO reaches a predetermined number. Since the number of output FIFO stages can be increased dynamically in correspondence with a signal that is input and output frequently, it is possible to reduce the possibility that a specific output FIFO becomes full and thus the checking process efficiency can be improved.

[9] In the equivalence checking method in paragraph 8, that the number of pieces of data held by the output FIFO reaches a predetermined number means, for example, that the difference between the value of the write pointer of the output FIFO and that of the read pointer of the output FIFO becomes an output FIFO threshold value (D(port)/2, D(port)×(N−1)/N, D(port)/N, or a value selected from among arbitrarily specified positive numbers) or more. It is possible to control whether or not to accept size up in accordance with the difference in the operation speed between writing and reading into/from the output FIFO.

[10] In the equivalence checking method in paragraph 9, for example, the output FIFO threshold value is a number increased in accordance with a variable (N) to be increased for each of the upsizing processes. It is made easier to properly control whether or not to accept the next upsizing after once upsized.

[11] An equivalence checking program according to another specific aspect of the present invention is a program causing a computer to execute first to fifth processes for equivalence checking of a model to be verified using a sample model the circuit of which has been described in a predetermined language and a test vector generation model for the sample model. The first process is a process in which the sample model inputs/outputs a signal from/to the sample model test vector generation model with cycle accuracy. The second process is a process for controlling writing an output from the sample model test vector generation model into an input FIFO group for each signal of the sample model with the same timing as that of the sample model. The third process is a process for reading data from the input FIFO group with the same operation timing as that of the model to be verified and outputting the data to the model to be verified. The fourth process is a process for writing an output of the sample model and an output of the model to be verified into an output FIFO pair group for each corresponding signal name. The fifth process is a process for carrying out coincidence judgment for a pair output for each signal name of the output FIFO pair group.

By causing a computer to execute the equivalence checking program, it is made possible to easily carry out the equivalence assessment of the model to be verified by utilizing the test bench of the sample model.

[12] In the equivalence checking program in paragraph 11, for example, the execution of the first process and second process is terminated when all of the input FIFOs in the input FIFO group come to hold data the number of pieces of which is not less than a number specified by a first input FIFO threshold value or when at least one of the input FIFOs becomes full and those processes are executed in the other states.

[13] In the equivalence checking program in paragraph 11, for example, the execution of the third process and fourth process is started when all of the input FIFOs in the input FIFO group come to hold data the number of pieces of which is a predetermined number or more.

[14] In the equivalence checking program in paragraph 13, for example, the third process and fourth process the execution of which has been started are terminated when all of the input FIFOs in the input FIFO group come to hold data the number of pieces of which is not more than a number specified by a second input FIFO threshold value or when at least one of the input FIFOs becomes empty and those processes are executed in the other states.

[15] The equivalence checking program in paragraph 11 further includes, for example, an upsizing process, as a process to be executed by a computer, to increase the number of FIFO stages each time the number of pieces of data held by the input FIFO reaches a predetermined number.

[16] In the equivalence checking program in paragraph 15, that the number of pieces of data held by the input FIFO reaches a predetermined number means, for example, that the difference between the value of the write pointer of the input FIFO and that of the read pointer of the input FIFO becomes a third input FIFO threshold value or more.

[17] In the equivalence checking program in paragraph 16, for example, the third input FIFO threshold value is a number increased in accordance with a variable (N) to be increased for each of the upsizing processes.

[18] The equivalence checking program in paragraph 11 further includes, for example, an upsizing process, as a process to be executed by a computer, to increase the number of FIFO stages each time the number of pieces of data held by the output FIFO reaches a predetermined number.

[19] In the equivalence checking program in paragraph 18, that the number of pieces of data held by the output FIFO reaches a predetermined number means, for example, that the difference between the value of the write pointer of the output FIFO and that of the read pointer of the output FIFO becomes an output FIFO threshold value or more.

[20] In the equivalence checking program in paragraph 19, for example, the output FIFO threshold value is a number increased in accordance with a variable (N) to be increased for each of the upsizing processes.

[21] A generating method for equivalence checking program according to yet another specific aspect of the present invention is a generating method of equivalence checking program for equivalence checking of a model to be verified using a sample model the circuit of which has been described in a predetermined language and a test vector generation model for the sample model and includes first to sixth processes as processes to be executed by a computer. The first process is a process for reading the sample model, the test vector generation model, and a parameter setting file into a computer. The second process is a process for generating a sample model test input fetch model in order to carry out an operation to write data that the sample model inputs from the sample model test vector generation model into an input FIFO group with cycle accuracy. The third process is a process for generating a model to be verified test input/output model in order to carry out an operation to read data from the input FIFO group in accordance with the operation timing of the model to be verified and output the data to the model to be verified. The fourth process is a process for generating a model of the input FIFO group based on the sample model test input fetch model and the model to be verified test input/output model. The fifth process is a process for generating an output FIFO pair group that inputs and holds an output of the sample model and an output of the model to be verified for each corresponding signal name. The sixth process is a process for generating a coincidence judgment model that carries out coincidence judgment of the output pair of each signal name of the output FIFO pair group.

By using this method, it is made possible to easily obtain an equivalence checking program for carrying out an equivalence assessment of a model to be verified by utilizing a test bench of a sample model.

2. Details of Embodiments

The embodiments are further described. In the following, the embodiments of the present invention will be described in detail based on the drawings. In all of the drawings for use in description of the embodiment, the members having the same function are assigned the same symbols and numerals as a rule and their repeated description is omitted.

<<Outline of Test Environment Utilizing Already Existing Test Bench>>

In FIG. 1, a configuration of a virtual test environment generated by a test environment generation method of the present invention is illustrated. The test environment shown in the drawing will make it possible to check the function of a model to be verified 2 that can take correspondence between ports for a sample model 1 using a sample model test vector generation model 3. The sample model 1 and the model to be verified 2 are supposed to have respective port names that correspond to each other in a one-to-one manner and have a relationship (equivalence of input/output) in which an equivalent output signal sequence can be obtained for an input signal sequence when time or timing is ignored. For example, with respect to the sample model 1, the model to be verified 2 has a relationship that the internal processes are pipelined or that an execution cycle is added to the internal operation. The sample model test vector generation model 3 can be regarded as a test bench to check the function of the sample model and the test environment in FIG. 1 enables checking of a model to be verified by utilizing the test bench of the sample model.

A test bench is configured as a program that can be executed by a computer, such as an engineering work station (EWS). In FIG. 1, the sample model 1, the model to be verified 2, the sample model test vector generation model 3, a sample model test input fetch model 4, an input FIFO group 5, a model to be verified test input/output model 6, an output FIFO pair group 7, a clock termination controller 8, and a coincidence judgment model 9 are regarded, respectively, as functionally divided program modules. Each of the program modules is executed by a computer.

The sample model 1 inputs/outputs a signal from/to the sample model test vector generation model 3 with cycle accuracy. The sample model test input fetch model 4 controls fetching an output from the sample model test vector generation model 3 with the same timing as that of the sample model 1 and writing (pushing) the output into an FIFO with a corresponding signal name (port name) in the input FIFO group 5. The model to be verified test input/output model 6 reads (pops) and fetches input data from the input FIFO group 5 with the same timing as that of the model to be verified 2 and outputs the fetched data to the model to be verified 2. The output FIFO pair group 7 holds the output of the sample model 1 and the output of the model to be verified 2 for each signal name. The FIFO of the output FIFO pair group 7 is pushed when the input value changes. The clock termination controller 8 controls each component in a test environment so that the input FIFO group 5 does not become full or empty. The coincidence judgment model 9 fetches, when both of the pair of the output FIFOs in the output FIFO pair group 7 have data that can be popped at their heads, the data from the relevant FIFO pair and compares the data for coincidence. With the arrangement, it is made possible to check the function of the model to be verified 2 having the equivalence of input/output for the sample model 1 by utilizing the test bench of the sample model. If cycle information is also stored in the output FIFO pair group 7, it is made possible to determine which portion of the simulation result waveform to compare when a discrepancy of output data is detected in the coincidence judgment model and therefore checking that takes a shift in a cycle into consideration is enabled. In addition, if the cycle information is confirmed, it is also made possible to confirm if a shift has occurred in an expected cycle. A generating method for the above-mentioned test environment will be described in detail below.

<<Outline of Test Environment Generation Process>>

Figure 2:
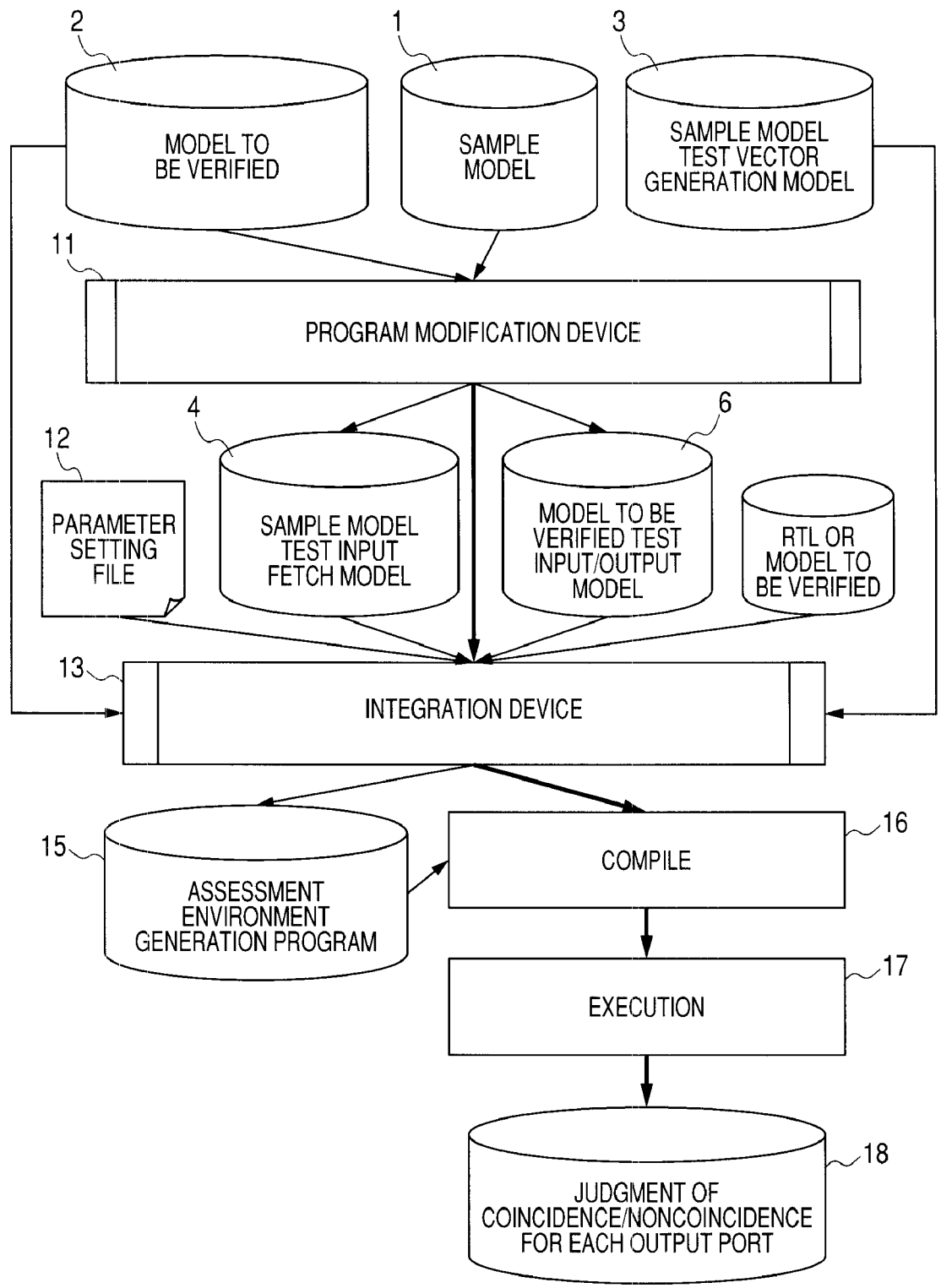
FIG. 2 is a flowchart showing an outline of a test environment generation process.

In FIG. 2, the outline of a test environment generation process is shown. The two models that can take correspondence between ports and the degrees of abstraction of which are different, that is, the sample model 1 and the model to be verified 2, and the sample model test vector generation model 3 are assumed to be an input into a program modification device 11. For example, it is assumed that the sample model 1 is described in the system level language, such as the System C, and the model to be verified 2 is described in the system level language or HDL (hardware description language). In particular, when the sample model 1 or the model to be verified 2 is a model described in HDL, the sample model 1 or the model to be verified 2 described in the system description language the operation of which coincides with the HDL description at a cycle level is also assumed to be an input. Here, the HDL description of the model to be verified 2 may be the RTL (register transfer level) description that is obtained as a result of the specification of an assigned cycle onto the program path for the sample model 1 or the composition with an operation composition tool by specifying pipelining. In many cases, a commercially available operation composition tool has a function to generate a model to be verified described in the system description language the operation of which coincides with the RTL at a cycle level, and therefore, it is assumed here that the model to be verified 2 is generated using the tool.

The program modification device 11 generates, from the sample model 1 described in the system level language, the sample model test input fetch model 4 that, immediately after fetching input data, writes the data into the input FIFO group 5, and generates the model to be verified test input/output model 6 that carries out the input data fetch to the model to be verified 2 described in the system level language or HDL from the input FIFO group and outputs the input data to the model to be verified 2.

An integration device 13 inputs the sample model 1, the model to be verified 2, the sample model test vector generation model 3, the sample model test input fetch model 4, the model to be verified test input/output model 6, and a parameter setting file 12 and generates the input FIFO group 5, the output FIFO pair group 7, and the coincidence judgment model 9 based thereon, as well as generating an assessment environment generation program 15 explained in FIG. 15 by integrating all of the generated models. The assessment environment generation program 15 is compiled and converted into executable code (16). A computer executes the assessment environment generation program 15 via the executable code (17) and can obtain coincidence or noncoincidence with the output of the sample model 1 with cycle accuracy for each output port of the model to be verified 2 (18). When the sample model 1 or the model to be verified 2 is described in HDL, it is recommended to use the co-simulation function of a commercially available simulator. Consequently, the integration by the integration device 13 also means the partial integration of the models so that assessment is possible using the co-simulation function.

When the assessment environment generation program 15 is executed, the sample model test input fetch model 4 transfers to the input FIFO group 5 the input data sequence that the sample model 1 has fetched from the sample model test vector generation model 3, and the model to be verified test input/output model 6 fetches data from the input FIFO group 5 with the timing with which the model to be verified 2 fetches input data and inputs the data into the model to be verified 2. At each of the output ports of the sample model 1 and the model to be verified 2, the output FIFO pair 7 is provided and the output FIFO pair 7, only when output value from the corresponding output port of the sample model changes, stores the value. While the data is stored at the head of both FIFOs of the output FIFO pair 7, the coincidence judgment model 9 compares the values and determines whether or not the output of the sample model 1 coincides with the output of the model to be verified 2, that is, carrying out equivalence judgment. The clock termination controller 8 acquires information about full/empty from the input FIFO group 5 and thereby controlling the clock of each model to avoid the full or empty state from occurring in the input FIFO group 5, that is, carrying out the operation termination control and the operation resumption control. The specification of the number of FIFO initial stages of the input FIFO group 5 and the output FIFO pair 7, the aspect of the change of the number of FIFO stages, etc., are set in the parameter setting file 12. It is assumed that default values are set by the integration device 13 when these specifications are not provided.

The port may be of pin accuracy or TL (Transaction Level) port as long as correspondence can be taken between the sample model and the model to be verified.

<<Flow Equivalence>>

Flow equivalence is said to exist between two circuits or functional blocks (processes) when equivalent input data sequence is input into each input port of both processes with time ignored and if data sequence to be obtained from each of the output ports of both the processes with time ignored coincides with and corresponds to each other. For example, when the order of the input/output of the input port group and the output port group and even the order of execution in respective processes are the same with time ignored in the two processes, if state transition graphs are constructed by connecting the state in which the input data has been fetched and the state in which the output data value has changed based on the order of execution, respectively, the state transition graphs will be in a relationship of Time Abstracted Bisimilar. In the entire configuration of the test environment disclosed in the present application, the control of the full/empty state is carried out in the FIFO, such as the input FIFO group 5, however, the result of this operation will be only that the output value of each process no longer changes with the same timing, and the equivalence judgment is done based on the change of the value, and therefore, the equivalence judgment is not affected. The details of the concept of the equivalence are described in, for example, a document, "Paul Le Guernic, Jean-Pierre Talpin, and Jean-Christophe Le Lann, 'POLY-CHRONY FOR SYSTEM DESIGN,' Journal of Circuits, Systems, and Computers, 12 (3), pp. 261-304, 2003".

<<Description of Sample Model>>

When the input description of the sample model 1 is, for example, the operation description in the system C described with cycle accuracy, the sample model test vector generation model 3 is a test bench of the operation description in the system C. It is, however, premised that both the sample model 1 and the sample model test vector generation model 3 are connected and a simulation is possible.

<<Description of Model to be Verified>>

For example, when the sample model 1 is created as the operation description in the system C with cycle accuracy, the model to be verified 2, which is an object of comparison in the operation coincidence verification, is the operation description obtained by pipelining the internal loop, pipelining the entire process, and arbitrarily applying the execution of cycle assignment onto the program path from a point to another point in a program, or RTL obtained by arbitrarily executing the above-mentioned three items with operation composition. The operation description of the model to be verified 2 can be obtained as the system C description output as a simulation model of RTL of the composition result by using a commercially available operation composition tool etc.

<<Parameter Setting File>>

The parameter setting file 12 specifies a parameter for the FIFO of the input FIFO group 5 (also referred to simply as input FIFO) and a parameter for the FIFO of the output FIFO pair 7 (also referred to simply as output FIFO).

Firstly, the parameter of the input FIFO group 5 is the number of FIFO stages. This is a parameter to set the number of FIFO stages to be arranged in correspondence with each input port. This parameter is used as a multiplier in the calculation of the number of FIFO stages in the input FIFO stage number determination process, to be explained separately. If there is no specification, it is assumed that, for example, two is adopted as a default value. The multiplier can also be specified arbitrarily. Secondly, the parameter is the setting relating to the content to be notified to the clock termination controller 8. The content to be notified to the clock termination controller 8 includes a notification to the effect that the amount of accumulated data of FIFO (the number of accumulated stages of data of FIFO) has reached a certain amount in order to terminate the operation clock on the pop side of FIFO until the certain amount is reached after the reset is cancelled, a notification to the effect that the amount of accumulated data of FIFO has reached or exceeded a certain fixed amount, and a notification to the effect that the amount of accumulated data of FIFO has fallen to or below a certain fixed amount. Parameters necessary for the above-mentioned notifications are determined using the setting parameter, N, with an input FIFO threshold value setting means, to be described later. When N is not specified, for example, four is adopted as a default value. Thirdly, the parameter is the setting relating to size up of FIFO. This is a parameter relating to a dynamic increase in the number of FIFO stages to be arranged in correspondence with each input port. The aspect that can be set with the parameter is either an increase in the number of stages to double that number unconditionally when the value of the write pointer to FIFO reaches, for example, the FIFO size or a value in the vicinity thereof, or an increase in the number of stages to double that number when "write pointer−read pointer=input FIFO threshold value, to be described later". In particular, it is assumed that the former is selected when the input FIFO threshold value, which will be described later, is not specified.

Firstly, the parameter of the output FIFO pair 7 is the number of FIFO stages. This is a parameter to set the number of FIFO stages to be arranged in correspondence with each output port. Based on the parameter value, the individual numbers of FIFO stages are determined in the output FIFO stage number determination process, to be described separately. When there is no specification, for example, eight stages are adopted as a default value. This number can also be specified arbitrarily. Secondly, the parameter is a setting relating to size up of the FIFO. This is a setting parameter relating to the increase in the number of FIFO stages to be arranged in correspondence with each input port. Either an unconditional increase in the number of stages to double that number when the value of the write pointer to FIFO reaches the FIFO size or a value in the vicinity thereof, or an increase in the number of stages to double that number when "write pointer−read pointer=input FIFO threshold value, to be described later". In particular, it is assumed that the former is selected when the input FIFO threshold value, which will be described later, is not specified.

<<General Generation Flow of Assessment Environment Generation Program>>

Figure 3:
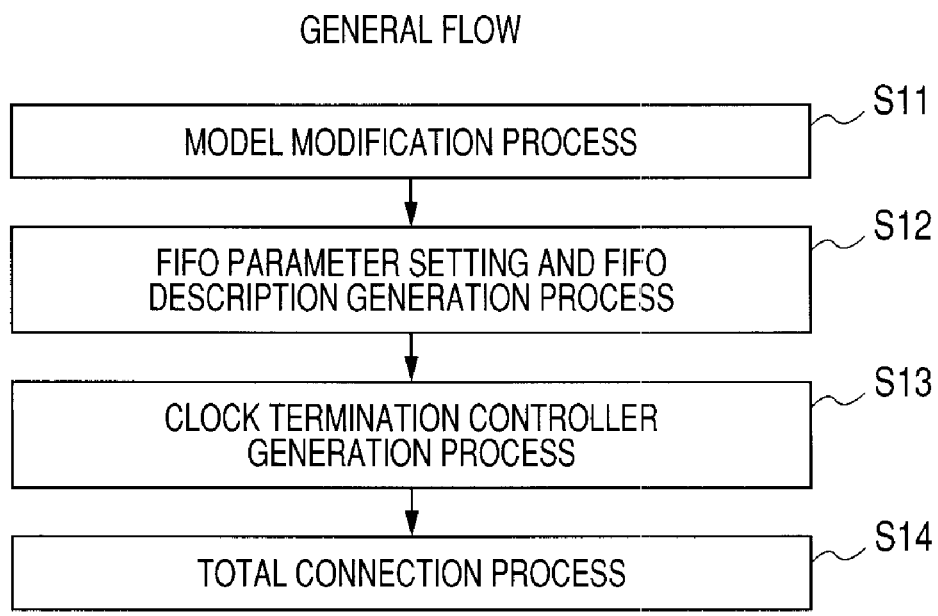
FIG. 3 is a flowchart generally illustrating a generation flow of an assessment environment generation program.

FIG. 3 generally illustrates a generation flow of an assessment environment generation program. The generation flow includes a model modification process (S11), a FIFO parameter setting and FIFO description generation process (S12), a clock termination controller generation process (S13), and a total connection process (S14).

The model modification process (S11) is a process to generate the sample model test input fetch model 4 that, immediately after having fetched input data based on the sample model 1 described in the system description language, writes the data into the input FIFO group, and to generate the model to be verified test input/output model 6 that fetches input data from the input FIFO group 5 and outputs the obtained input data based on the model to be verified 2 described in the system description language.

The FIFO parameter setting and FIFO description generation process (S12) is a process to generate the description of the input FIFO group 5 and the output FIFO pair 7, in which the number of FIFO stages of each FIFO, the amount of the remaining FIFOs required to signal a notification to the clock termination controller 8, the aspect of the increase in the stage number, etc., of the input FIFO group 5 and the output FIFO pair 7 are set.

The clock termination controller generation process (S13) is a process to generate the description of the module that controls the termination of clock supply and the resumption of clock supply to the pre-stage module group including the sample model 1, the sample model test vector generation model 3, and the sample model test input fetch model 4 and the post-stage module group including the model to be verified 2 and the model to be verified test input/output model 6 when receiving the signal notification from the input FIFO group 5.

The total connection process (S14) is a process to connect the model obtained by the model modification process, the input FIFO group 5, the output FIFO pair 7, the clock termination controller 8, the sample model 1, the model to be verified 2, and the coincidence judgment model 9.

<<Model Modification Process>>

Figure 4:
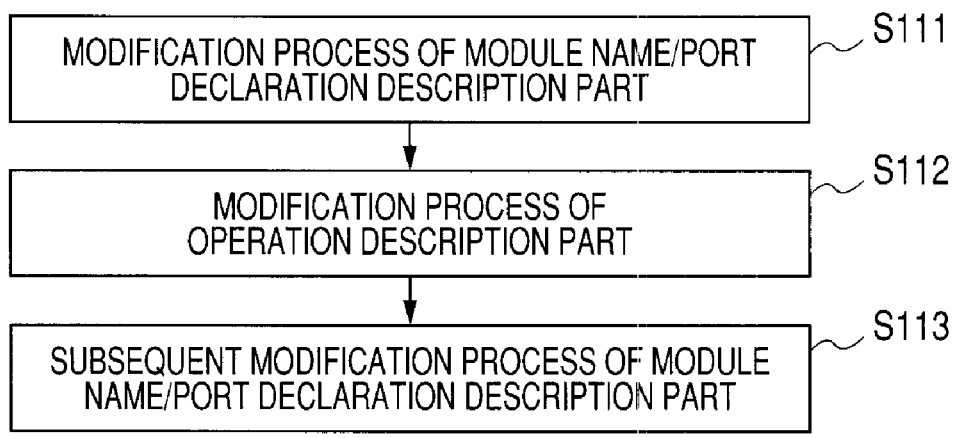
FIG. 4 is a flowchart showing details of a model modification process (S11).

The model modification process (S11) will be described in detail. As illustrated in FIG. 4, the model modification process (S11) includes a modification process of module name/port declaration description part (S111), a modification process of operation description part (S112), and a subsequent modification process of module name/port declaration description part (S113).

Figure 5:
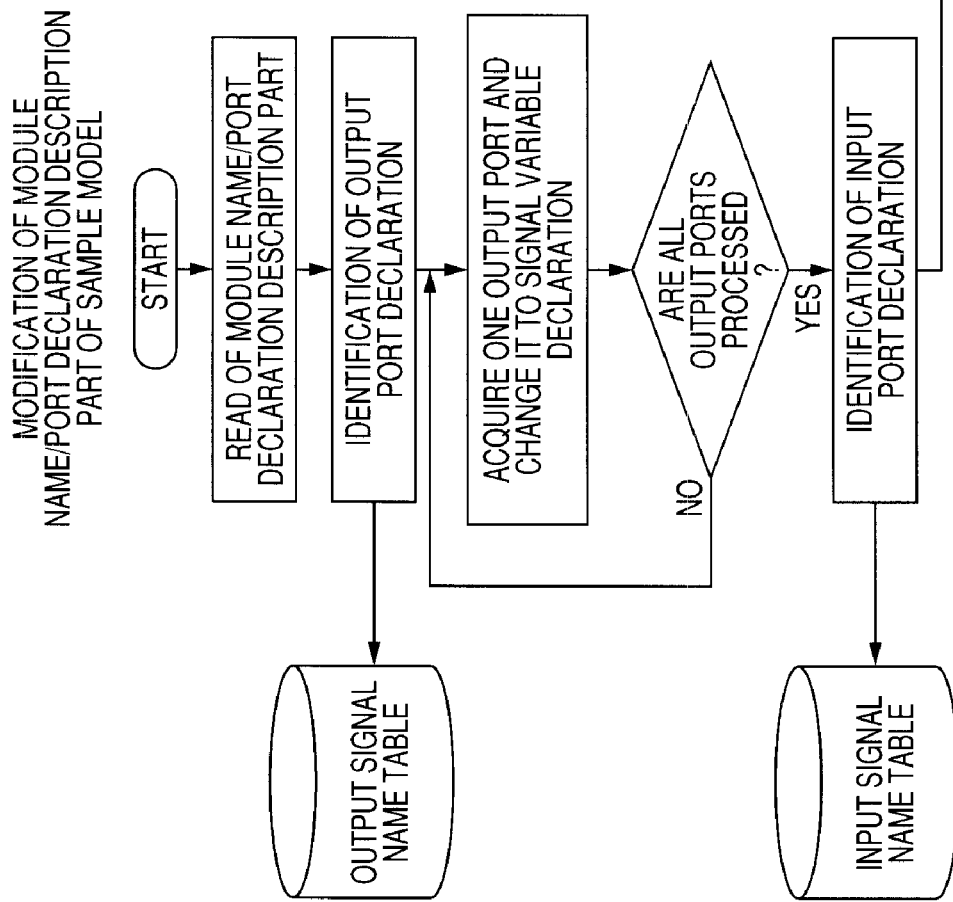
FIG. 5 is a flowchart illustrating details of a modification process of module name/port declaration description part for a sample model (S111).

First, the modification process of module name/port declaration description part (S111) will be described. FIG. 5 illustrates the details of the modification process of module name/port declaration description part (S111) for the sample model 1. This process is a process to modify the header description. That is, in this modification process, the identification of the module name, the input port declaration, and the output port declaration is carried out with the module name/port declaration description part of the sample model description as an input, the module name is modified, and the function prototype declaration of the input FIFO corresponding to each input port is defined based on each input port variable, and then the function prototype declaration of the input FIFO newly defined is added to the port declaration description part. The identified output port declaration is modified to a signal variable declaration. The identified input signal name and output signal name are stored in the input signal name table and the output signal name table, respectively. In the output signal name table, the type of the signal is also registered with reference to the correspondence table in FIG. 11. The obtained module name/port declaration description port is stored in the input signal table as "_original file name".

It is assumed here that the prototype declaration of the input FIFO function is given as "void fifo_input signal name (char rst, char rw_flg, input signal type wdata, input signal type * rdata);". As a result, it is assumed that, when the prototype declaration is added, the information about the input signal name and the type of the input signal is obtained from the information of the identified input port and they are replaced with others appropriately. The meaning of the argument of the input FIFO function, char rst, char rw_flg, the input signal type wdata, and the input signal type * rdata are as follows. The initial operation is specified with char rst;//0, the normal operation, with 1, FIFO is read with char rw_flg;// 1, FIFO is written with 0, when the input signal type wdata;// rw_flg is set to 1, the data of wdata is pushed to the FIFO and when the input signal type * rdata;//rw_flg is set to 0, data is popped from the FIFO and reflected in the value of rdata.

Figure 6:
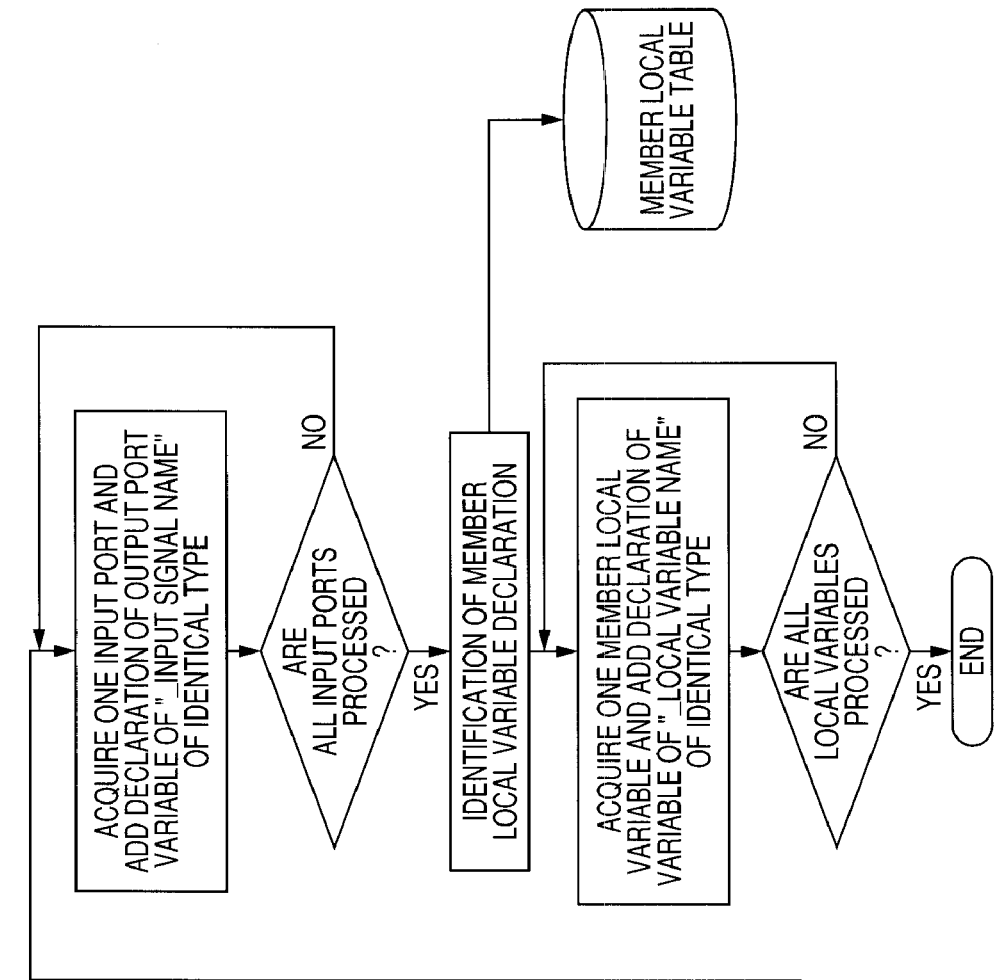
FIG. 6 is a flowchart illustrating details of a modification process of module name/port declaration description part for a model to be verified (S111).

FIG. 6 illustrates the details of the modification process of module name/port declaration description part (S111) for the model to be verified 2. In this modification process, the input port declaration and the function prototype declaration are identified with the module name/port declaration description part of the model to be verified description as an input, a new function is defined based on the function prototype declaration, a new output port variable is defined based on each input port variable, and the newly defined output port variable declaration and the function prototype declaration are added to the already modified module name port declaration description part of the sample model ("_original file name"). When there is a member local variable declaration, it is identified and stored in the member local variable table, and a variable declaration is added, in which the variable name of each local variable is modified to "_local variable name".

FIG. 7 illustrates the module name/port description part of the sample model 1 and the transformation result according to the procedure in FIG. 5. The underlined parts are the description parts added by the transformation.

FIG. 8 illustrates the module name/port description part of the model to be verified 2 and the transformation result according to the procedure in FIG. 6. The underlined parts in FIG. 8 are the description parts embedded for the transformation result in FIG. 7.

Next, the modification process of operation description (S112) will be described. FIG. 9 conceptually shows the common process for both the sample model and the function verification model to modify the operation description. First, the description is expanded into each control flow graph (CFG) and then the transformation in code is carried out from an if (conditional expression)—else if (conditional expression) branch structure into an if (conditional expression)—else (if (conditional expression)) branch structure as shown schematically.

FIG. 10 shows a flowchart of a process to transform the operation description of a sample model to that of a sample model test input fetch model, including the transformation process shown in FIG. 9. The information about the input signal variable name and type is read from the input signal name table and a local variable declaration description of the same type, that is, "tmp_input signal name", or of a type determined based on the correspondence to the next section is inserted into the operation description part for each input signal. In particular, it is assumed that when the variable type of the input signal variable is the System C data type of sc_uint<T> or sc_int<T>, the type of the local variable within a function to be declared as "tmp_input variable name" is determined using the correspondence table in FIG. 11. This type determination operation is assumed to be also executed for the output FIFO similarly.

Figure 12:
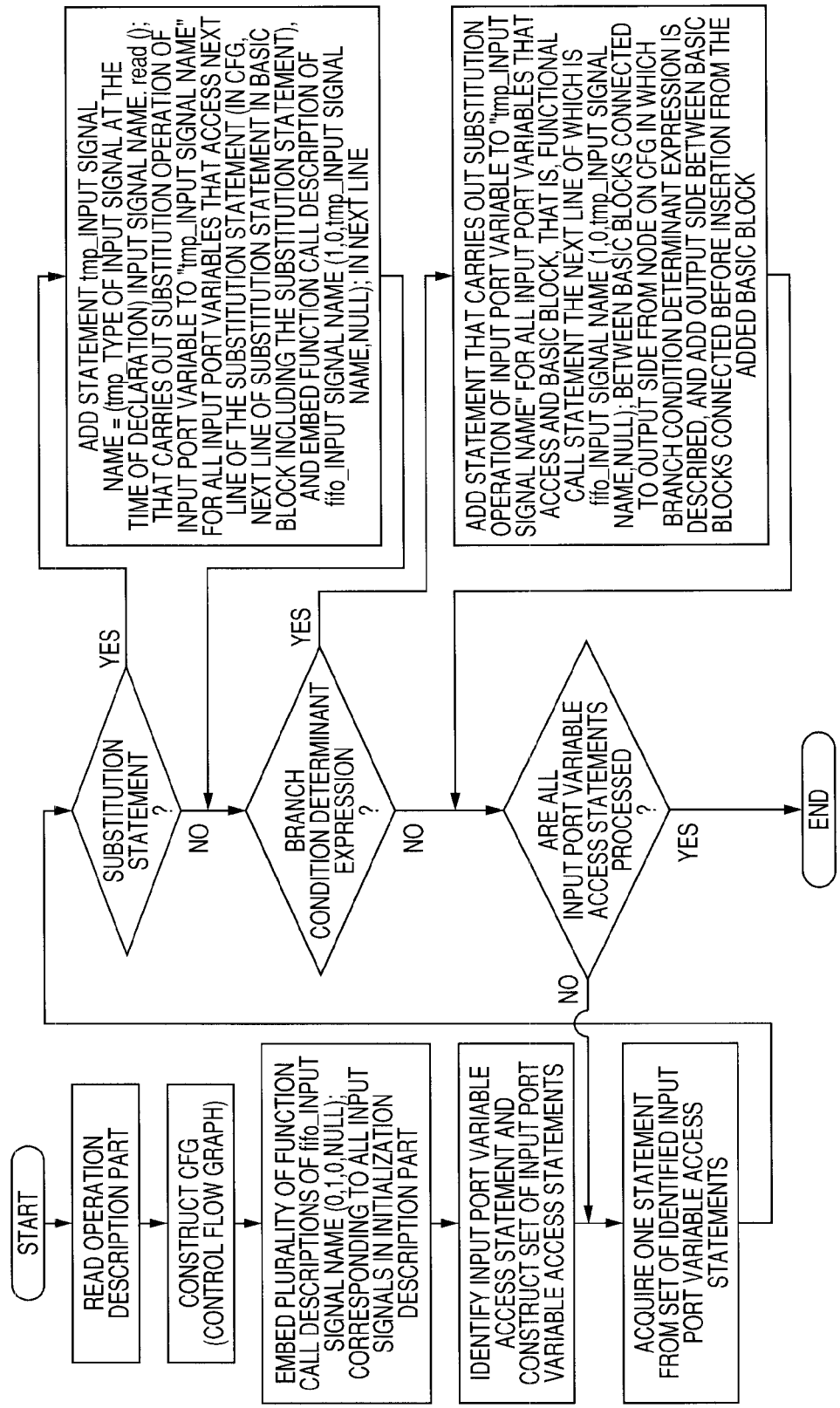
FIG. 12 is a flowchart showing a specific example of a modification process of an operation description part for a sample model.
Figure 14:
FIG. 14 is an explanatory diagram illustrating an operation description part of a sample model and a transformation result in a process in FIG. 12.

FIG. 12 shows a specific example of the modification process of the operation description part for the sample model 1. The operation description of the sample model is read and the initialization description of the FIFO function generated for each input port is embedded in the initialization description part of the operation description, and in the internal operation description part, the value read from the input port is substituted for the variable of "tmp_input signal name" and the variable is passed to the argument of the FIFO function, and thereby, the embedment of the description to realize the push operation of the input signal value to the FIFO is carried out. FIG. 14 illustrates the operation description part of the sample model and the transformation result by the process in FIG. 12.

Figure 13:
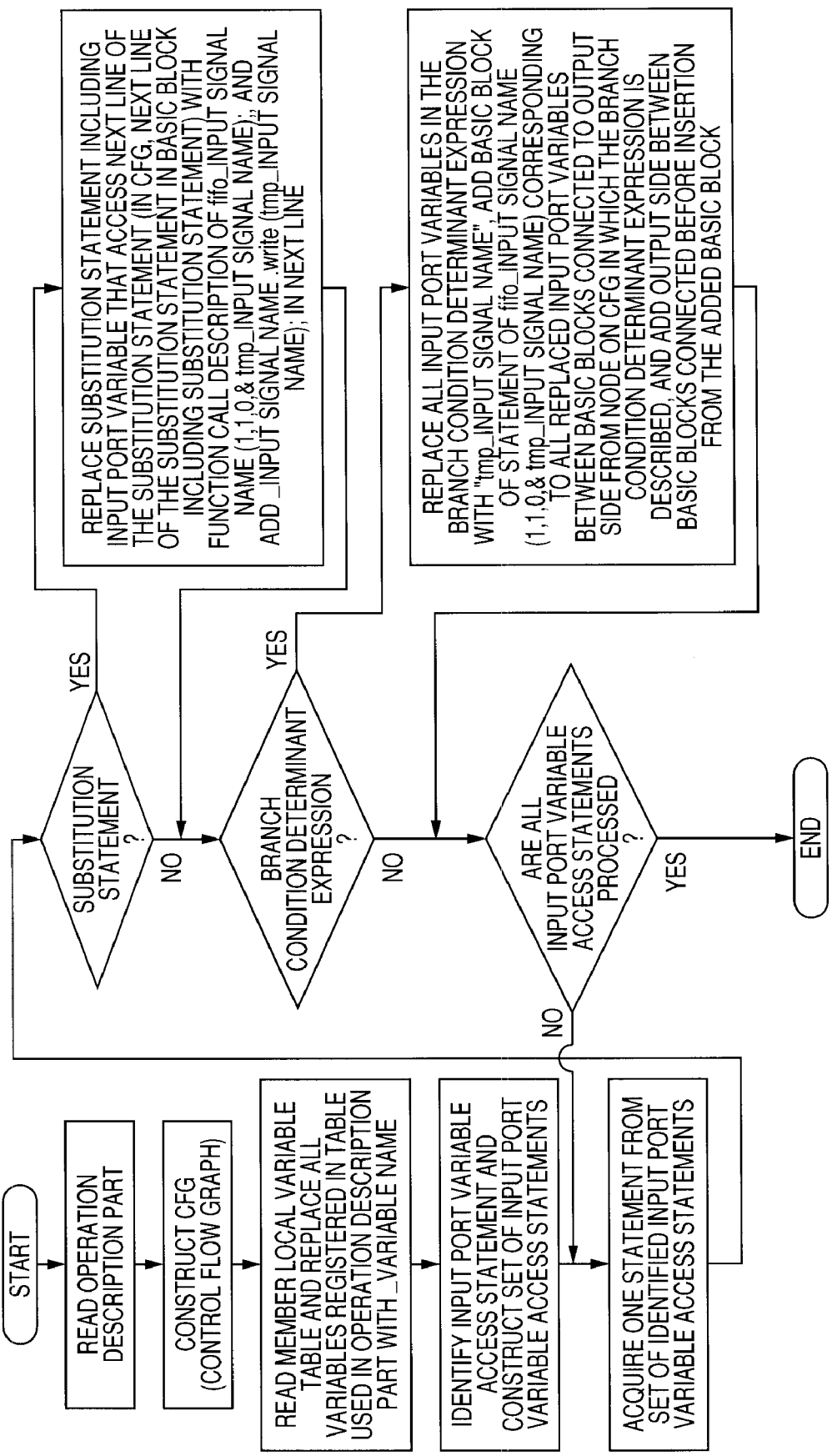
FIG. 13 is a flowchart showing a specific example of a modification process of an operation description part for a model to be verified.

FIG. 13 shows a specific example of the modification process of the operation description part for the model to be verified 2. The operation description of the model to be verified is read and the FIFO function call description constructed in correspondence with each input port with the variable of "tmp_input signal name" as an argument is embedded in the internal operation description part that has read the operation description, and thereby, the value read from FIFO by the pop operation is substituted for "tmp_input signal name" and a sentence to substitute the substituted "tmp_input signal name" for "_input signal name" is embedded, and thus, the input signal output to the model to be verified is realized. FIG. 15 illustrates the operation description part of the model to be verified and the transformation result by the process in FIG. 13.

Figure 16:
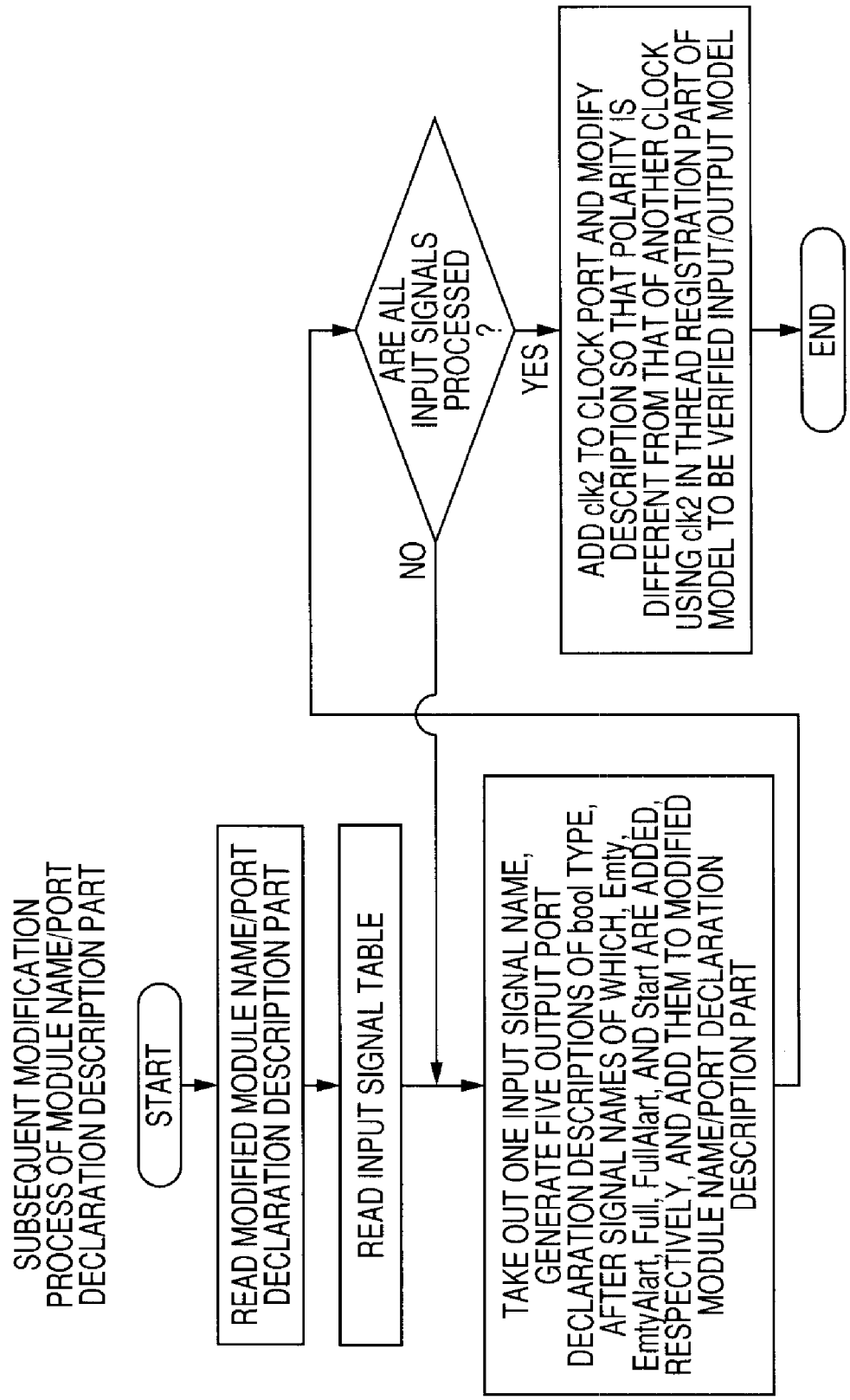
FIG. 16 is a flowchart showing an example of a subsequent modification process of a module name/port declaration description part (S113).

Next, the subsequent modification process of module name/port declaration description part (S113) will be described. This process is a modification process for termination control. FIG. 16 shows an example of the subsequent modification process of module name/port declaration description part (S113). A process is carried out to read the module name/port declaration description generated in the module name/port declaration description modification (S111) and the input signal table, add the output port declaration descriptions of bool type, whose names are input signal name Empty, input signal name EmptyAlart, input signal name Full, input signal name FullAlart, and input signal name Start, to each input signal, and invert the clock polarity description in the thread registration of the model to be verified test input/output model. It is assumed that the output file name after modification is the same as the input file name before modification. FIG. 17 illustrates the transformation result by the modification process in FIG. 16.

<<FIFO Parameter Setting and FIFO Description Generation Process>>

FIG. 18 illustrates the details of the FIFO parameter setting and FIFO description generation process S12. The process in S12 includes a size determination process of the input FIFO to be configured for each input signal for which a function call is made by the sample model test input fetch model and the model to be verified test input/output model (S121), a generation process of the model (S122), a size determination process of the output FIFO to be configured for each output signal of the sample model and the model to be verified (S123), a generation process of the model (S124), and a generation process of the signal output coincidence judgment model to determine whether or not the signal outputs coincide with each other by fetching the output signals from the two output FIFOs connected to the respective output signals of the same name in the sample model and the model to be verified, and comparing the signal values (S125).

<<Parameter Setting and Description Generation Relating to Input FIFO Group>>

As to the number of FIFO stages of an input FIFO model, the following basic idea will be adopted. It is assumed that a parameter to set the number of FIFO stages to be arranged in correspondence with each input port is N. This parameter N is used as a multiplier in the calculation of the number of FIFO stages in an input FIFO stage number determination process, to be described below. It is assumed that, for example, two is adopted as a default value when not specified. Alternatively, the value may also be specified arbitrarily.

When the number of FIFO stages is determined, the maximum value OrigInMax (port) and the minimum value OrigInMin (port) in the access interval cycle of each input port of the sample model 1, and the maximum value TgtInMax (port) and the minimum value TgtInMin (port) in the access interval cycle of each input port of the model to be verified are acquired, and when the number of FIFO stages to be arranged in correspondence with each input port is determined, if OrigInMin (port)=TgtInMin (port), the number of FIFO stages to be connected to the input port is set to ceil (OrigInMax (port)/TgtInMin (port))×N. However, when the result of calculation is eight or less, the value of N is adjusted so that the result will be eight or greater. If OrigInMin (port)<TgtInMin (port), the number of FIFO stages to be connected to the input port is set to ceil (TgtInMax (port)/OrigInMin (port))×N. However, when the result of calculation is eight or less, the value of N is adjusted so that the result will be eight or greater.

For the acquisition of the maximum value and the minimum value in the access interval cycle, the technique by ILP described in the document "Yau-Tsun Steven Li and Sharad Malik, 'Performance analysis of embedded software using implicit path enumeration,' IEEE Trans. on CAD of Integrated Circuits and Systems 16 (12), pp. 1477-1487, 1997" can be used, and thus, it is possible to find the maximum value and the minimum value in the program execution cycle between target input ports using the processing time of the basic block in the document as the execution cycle number described in the model.

Figure 19:
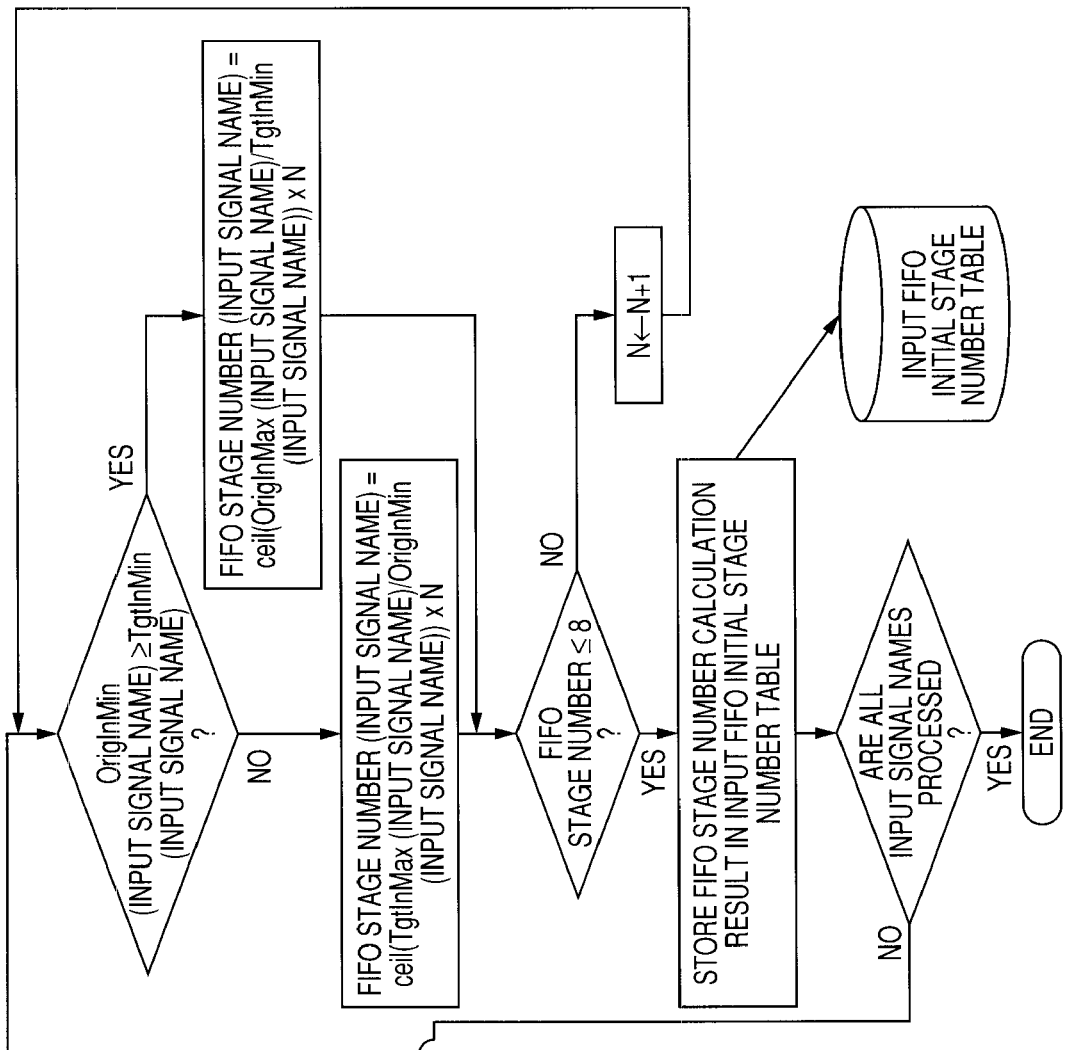
FIG. 19 is a flowchart illustrating a determination process of FIFO stage number constituting an input FIFO group.

FIG. 19 illustrates a determination process flow of the number of FIFO stages constituting the input FIFO group. For example, when the input file form is set to "FIFO_DEPTH_PARAM=N", the input file is read and the last numerical value is acquired, the input signal name table, the sample model, and the model to be verified are read, the process described in the previous section is carried out, and the initial number of input FIFO stages corresponding to each input port is stored in the input FIFO initial stage number table.

The setting relating to the content to be notified to the clock termination controller 8 will be described. The content to be notified to the clock termination controller includes (1) a notification to the effect that the amount of accumulated data of FIFO has reached a certain amount in order to terminate the clock in the post-stage of FIFO until the certain amount is reached after the reset is canceled, (2) a notification to the effect that the amount of accumulated data of FIFO has reached or exceeded a certain fixed amount, and (3) a notification to the effect that the amount of accumulated data of FIFO has fallen to or below a certain fixed amount. The setting parameter is assumed to be N and values used to notify (1), (2), and (3) are determined using N in an input FIFO threshold value setting process, to be described below. When N is not specified, for example, four is adopted as a default value. Only integers greater than or equal to four and less than or equal to the minimum stage number of the FIFO corresponding to the output port may be specified as N. If this is violated, the above default value is adopted. Each time the FIFO stage number is doubled, the value of N is similarly corrected and doubled. The parameter of the above (1) is DInit (port)/2 when the initial stage number of FIFO corresponding to each input port is assumed to be DInit (port). The parameter of the above (2) will be D (port)×(N−1)/N when the stage number that has taken into consideration the dynamic increase in the stage number of FIFO corresponding to each input port is assumed to be D (port). The parameter of the above (3) will be D (port)/N.

The method of notification to the clock termination controller 8 is as follows. Whether or not all of the input FIFOs after the reset is canceled have reached or exceeded the parameter value of (1) is notified by a 1-bit signal "input signal name Start". Whether or not each input FIFO has reached or exceeded the parameter value of (2) is notified by a 1-bit signal "input signal name Full". Whether or not each input FIFO has fallen to or below the parameter value of (3) is notified by a 1-bit signal "input signal name Empty".

Dynamic size up of the input FIFO will be described. The setting parameter relating to the increase in the stage number of FIFO to be arranged in correspondence with each input port can be set as follows. Either an unconditional increase in the FIFO stage number to double that when the write pointer to the input FIFO has reached the size of the input FIFO or its vicinity, or an increase in the FIFO stage number to double that when "write pointer—read pointer=input FIFO threshold value, to be described later" is specified. In particular, when the input FIFO threshold value, to be described later, is not specified, the former will be selected. As the latter input FIFO threshold value, D (port)/2 [character string "HALF"], D (port)×(N−1)/N [character string "FULL"], D (port)/N [character string "EMPTY"], and an arbitrarily specified positive value (however, less than or equal to the initial FIFO stage number) may be specified. Here, D (port) denotes a stage number that has taken into consideration the dynamic increase in the input FIFO stage number and N denotes a variable that doubles each time the FIFO stage number increases.

As a size up specification file format of an input FIFO, for example, it is made possible to specify the input file format to "FIFO_SIZE_UP=character string" and HALF, FULL, EMPTY, a positive value, or null as a character string. As a matter of course, the character string FULL and EMPTY do not correspond to the actual full state or empty state of the input FIFO. What correspond to those are the input signal name FullAlart and the input signal name EmptyAlrt.

<<Specifications of Operation Relating to Input FIFO Group>>

Here, the specifications of operation of the input FIFO will be described in an ordered manner. 1) Pushing into the input FIFO is carried out each time a FIFO function call is made with the first argument char rest being one in the sample model test input fetch model 4. 2) Popping from the input FIFO is carried out each time a FIFO function call is made in the model to be verified test input/output model 6. 3) As to the size up of an input FIFO, during the period until the first popping is carried out for the input FIFO, the size is increased to double that when the write pointer of the input FIFO reaches "the stage number—1" of the input FIFO. During the period after the popping operation has been carried out once for the input FIFO, the size is increased to double that when the write pointer of the input FIFO reaches "the stage number—1" of the input FIFO in the case where there is no threshold value setting, or the size is increased to double that when "the write pointer−read pointer=threshold value" in the case where there is a threshold value setting. 4) The input signal name Start is asserted at all times after the number of pieces of data within the input FIFO exceeds half the initially set stage number and is de-asserted until it exceeds half the number. 5) The input signal name Ful is asserted when the data accumulated stage number within the input FIFO reaches or exceeds a value corresponding to the stage number determined by D (port)×(N−1)/N described above, and is de-asserted in other cases. 6) The input signal name FullAlart is asserted when the input FIFO becomes full, and is de-asserted in other cases. 7) The input signal name Empty is asserted when the data accumulated stage number within the input FIFO falls to or below a value corresponding to the stage number determined by D (port)/N described above, and is de-asserted in other cases. 8) The input signal name EmptyAlart is asserted when the input FIFO becomes empty, and is de-asserted in other cases.

<<Generation of FIFO Description Relating to Input FIFO Group>>

Figure 20:
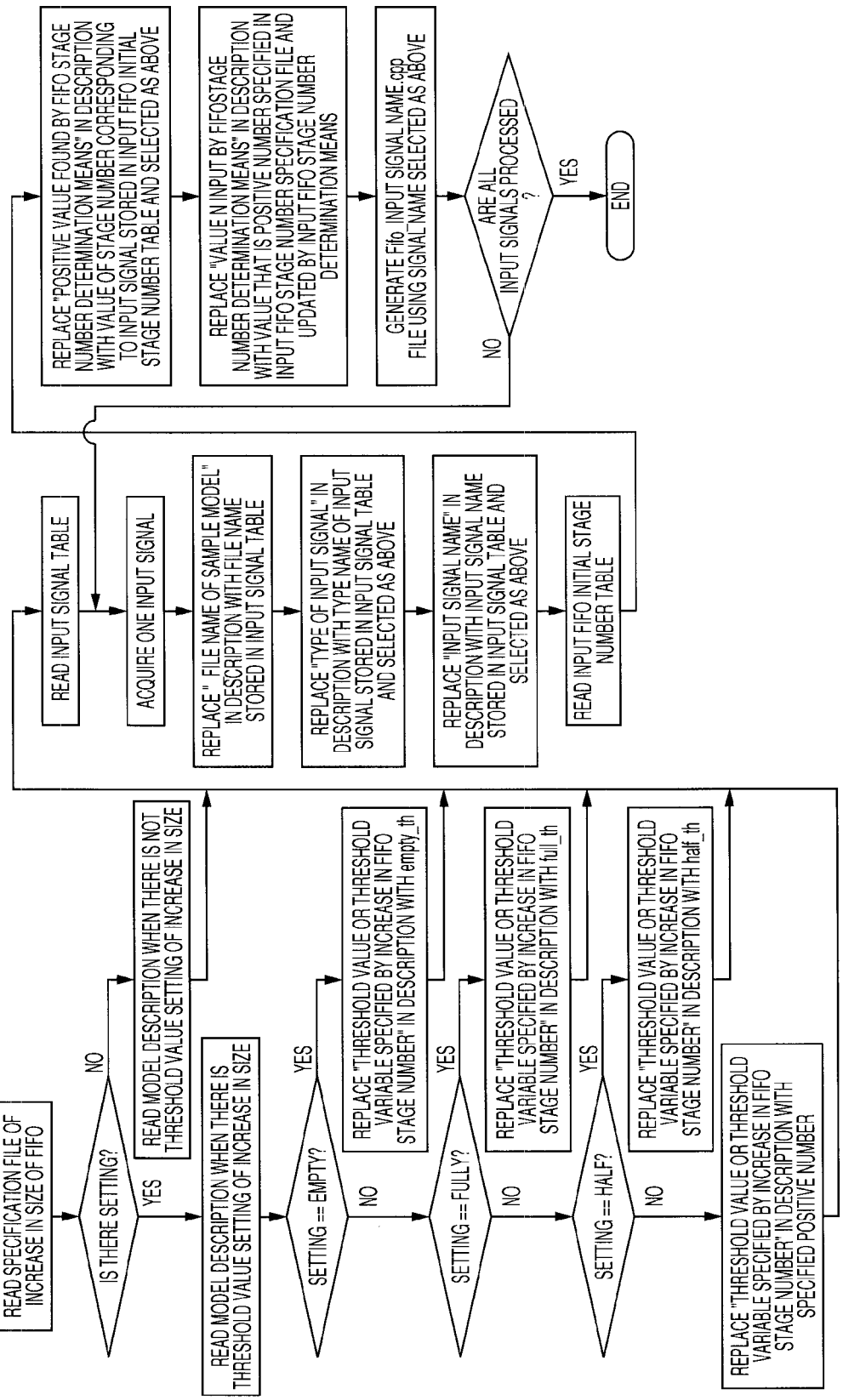
FIG. 20 is a flowchart illustrating a process to generate an input FIFO description.

FIG. 20 illustrates a process to generate the description of the input FIFO. For the generation of the description of the input FIFO, first, the FIFO size up specification file is read, the model description when there is no threshold value setting of size up or the model description when there is a threshold value setting of size up is read, the input signal table and the initial input FIFO stage number table are read, and the keyword within the model description is replaced with another appropriately for each input signal name, and then a file with a file name "fifo_input signal name.cpp" is generated for each input signal name.

For example, when there is no threshold value setting of size up, the FIFO size up specification file is read and when there is no description after "=", the following process is carried out. First, the model description of FIFO function, the input signal table, and the initial input FIFO stage number table are read and the following replacements are carried out in the model description for each input signal name, and thus, a fifo_input signal name.cpp file is generated. The "_sample model file name" is replaced with a file name stored in the input signal table and the "type of input signal" is replaced with a type name associated with an input signal within the input signal table. The "value N input by the FIFO stage number determination means" is replaced with a value, which is a positive number specified in the input FIFO stage number specification file and updated in the FIFO stage number determination process. The "positive number found in the FIFO stage number determination process" is replaced with a positive number associated with an input signal name within the input FIFO initial stage number table. The "input signal name" is replaced with an input signal name being targeted currently. FIG. 21 and FIG. 22 illustrate the description of the input FIFO generated when there is no threshold value setting of size up.

When there is no threshold value setting of size up, the FIFO size up specification file is read and when there is described any of HALF, EMPTY, FULL, and a positive number after "=", the following process is carried out. First, the model description of FIFO function, the input signal table, and the initial FIFO stage number table are read and the following replacements are carried out in the model description for each input signal name, and thus, a fifo_input signal name.cpp file is generated. The "_sample model file name" is replaced with a file name stored in the input signal table. The "type of input signal" is replaced with a type name associated with an input signal within the input signal table. The "value N input in the FIFO stage number determination process" is replaced with a value, which is a positive number specified in the input FIFO stage number specification file and updated in the FIFO stage number determination process. The "positive value found in the FIFO stage number determination process" is replaced with a positive number associated with an input signal name within the input FIFO initial stage number table. The "threshold value or threshold variable specified by an increase in the FIFO stage number" is replaced with half_th when HALF is specified, or empty_th when EMPTY is specified, or full_th when FULL is specified, or a positive number when a positive number is specified. The "input signal name" is replaced with an input signal name being targeted currently. FIG. 23 to FIG. 25 illustrate the description of the input FIFO generated when there is a threshold value setting of size up.

<<Parameter Setting and Description Generation Relating to Output FIFO Pair>>

Next, the parameter setting and the FIFO description generation process relating to the output FIFO pair 7 will be described. About the stage number of output FIFO constituting the output FIFO pair 7, the following basic idea will be adopted. The setting parameter of the stage number of output FIFO to be arranged in correspondence with each output port is assumed to be N. Based on the parameter value, each stage number of output FIFO is determined in the output FIFO stage number determination process, to be described below. It is assumed that eight stages are adopted as a default value when there is no specification. Only integer values greater than or equal to the default value can be specified as the parameter N. It may also be specified arbitrarily.

When the output FIFO stage number is determined, the maximum value OrigOutMax (port) and the minimum value OrigOutMin (port) in the access interval cycle of each output port of the model with cycle accuracy, which is a sample model, and the maximum value TgtOutMax (port) and the minimum value TgtOutMin (port) in the access interval cycle of each output port of the operation model, which is an object to be compared, are acquired, and if OrigOutMin (port)=TgtOutMin (port), the stage number of FIFO to be connected to the output port is set to N and the stage number of output FIFO to be connected to the output port of the model to be verified, which is an object to be compared, is set to ceil (OrigOutMax (port)/TgtOutMin (port))×N. If OrigOutMin (port)<TgtOutMin (port), the stage number of output FIFO to be connected to the output port of the sample model is set to ceil (TgtOutMax (port)/OrigOutMin (port))×N and the stage number of output FIFO to be connected to the output port of the model to be verified, which is an object to be compared, is set to N. In this manner, the stage number of output FIFO to be arranged in correspondence with each output port is determined.

For the acquisition of the maximum value and the minimum value in the access interval cycle, the technique by ILP described in the document "Yau-Tsun Steven Li and Sharad Malik, 'Performance analysis of embedded software using implicit path enumeration,' IEEE Trans. on CAD of Integrated Circuits and Systems 16 (12), pp. 1477-1487, 1997" can be used, and thus, it is possible to find the maximum value and the minimum value in the program execution cycle between target output ports using the processing time of the basic block in the document as the execution cycle number described in the model.

Figure 26:
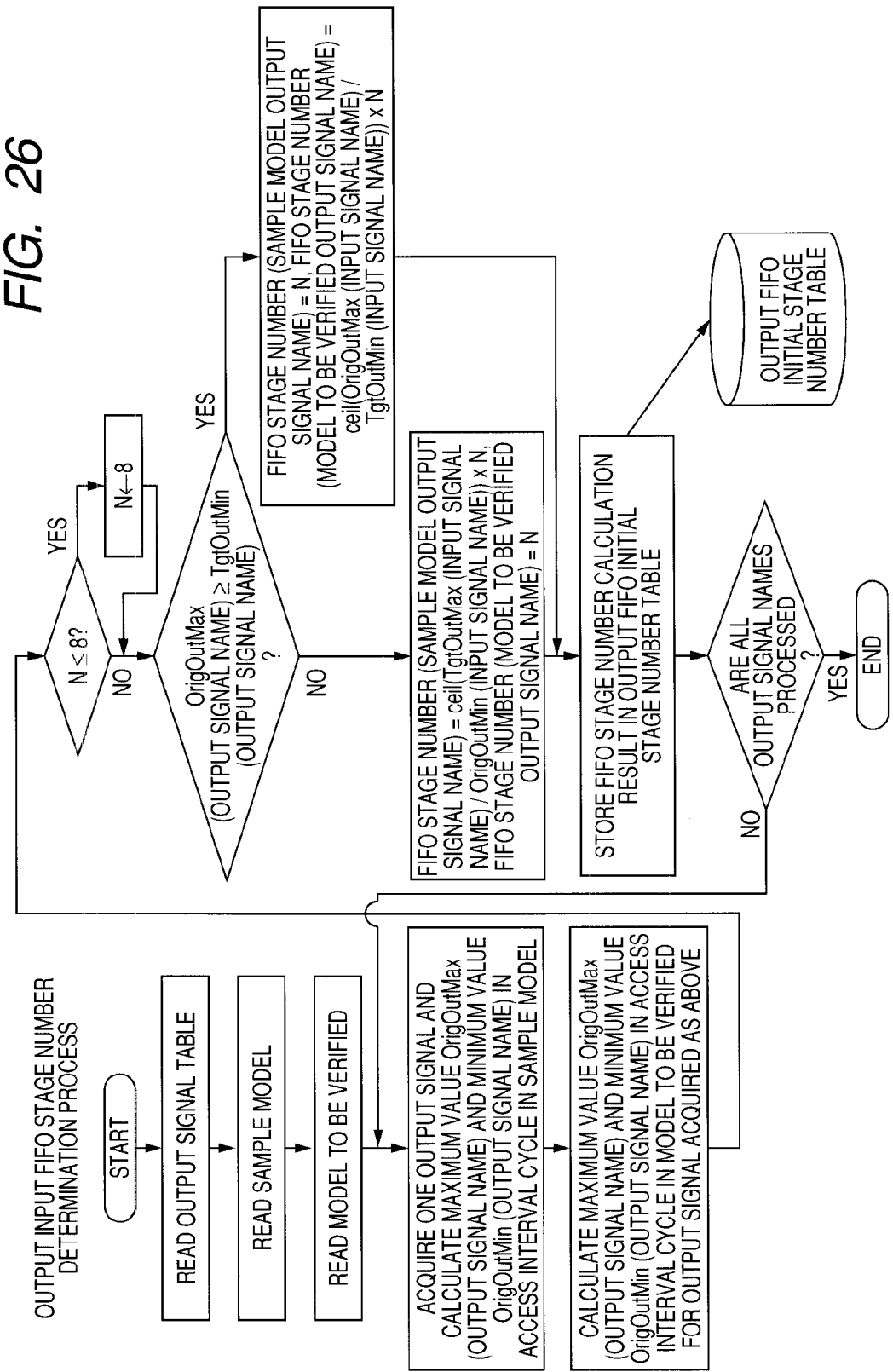
FIG. 26 is a flowchart illustrating a determination process of output FIFO stage number constituting an output FIFO pair group.

FIG. 26 shows a process flow to determine the stage number of output FIFO constituting the output FIFO pair 7. For example, when the input file format is set to FIFO_DEPTH_PARAM=N, the input file is read and the last numerical value is acquired, the output signal name table, the sample model 1, and the model to be verified 2 are read, the process described in the previous section is carried out, and the initial stage number of output FIFO corresponding to each output port is stored in the output FIFO initial stage number table.

The size up of the output FIFO pair 7 will be described. The parameter relating to the increase in the stage number of output FIFO to be arranged in correspondence with each output port can be set as follows. Either the setting of an unconditional increase in the stage number to double that when the write pointer to the output FIFO has reached the size of the FIFO or its vicinity, or the setting of an increase in the stage number to double that when "write pointer−read pointer=output FIFO threshold value, to be described later" is selected. In particular, when the output FIFO threshold value, to be described later, is not specified, the former will be selected. As the output FIFO threshold value, D (port)/2 [character string "HALF"], D (port)*(N−1)/N [character string "FULL"], D (port)/N [character string "EMPTY"], or an arbitrarily specified positive number (however, the initial FIFO stage number or less) may be specified. Here, D (port) denotes a stage number that has taken into consideration the dynamic increase in the output FIFO stage number and N denotes a variable that doubles each time the FIFO stage number increases.

As a size up specification file format of an output FIFO, for example, it is made possible to specify the input file format to "FIFO_SIZE_UP=character string" and HALF, FULL, EMPTY, a positive value, or null as a character string.

<<Specifications of Operation Relating to Output FIFO Pair>>

Here, the specifications of operation of the output FIFO pair 7 will be described. As for one output FIFO (sample model output FIFO) of the output FIFO pair 7 to be connected to the output port of the sample model 1, its operation is started after the system reset is canceled. In the first cycle, a signal from the connected output port is received and the data is pushed into the internal FIFO and the clock count is pushed into the internal clock value storage FIFO. After that, while the clock is incremented for each cycle, a signal is received only when the value of the output port changes and the data is pushed into the internal FIFO and the clock count is pushed into the internal clock value storage FIFO. When the internal FIFO is empty, the output signal "Orig output signal name Empty" is set to one and when not empty, to zero. Only when the input signal "Orig output signal name Read" from outside is one, data is popped from the internal FIFO and data is output via "Orig output signal name", which is an output signal, and the clock count value is popped from the internal clock value storage FIFO, and then data is output via "Orig output signal name Clk", which is an output signal. When the write pointer of the internal FIFO reaches "the FIFO stage number—1", the stage number is doubled after the condition is determined based on the setting, if necessary.

As for the other output FIFO (model to be verified output FIFO) of the output FIFO pair 7 to be connected to the output port of the model to be verified, its operation is started after the signal "start" changes from zero to one. In the first cycle, a signal from the connected output port is received and the data is pushed into the internal FIFO and the clock count is pushed into the internal clock value storage FIFO. After that, while the clock is incremented for each cycle, a signal is received only when the value of the output port changes and the data is pushed into the internal FIFO and the clock count is pushed into the internal clock value storage FIFO. When the internal FIFO is empty, the output signal "Tgt output signal name Empty" is set to one and when not empty, to zero. Only when the input signal "Tgt output signal name Read" from outside is one, data is popped from the internal FIFO and data is output via "Tgt output signal name", which is an output signal, and the clock count value is popped from the internal clock value storage FIFO, and then data is output via "Tgt output signal name Clk", which is an output signal. When the write pointer of the internal FIFO reaches "the FIFO stage number—1", the stage number is doubled after the condition is determined based on the setting, if necessary.

<<Generation of FIFO Description Relating to Output FIFO Pair>>

FIG. 27 shows the header file generation process of the sample model output FIFO. In this process, the header file model description of the sample model output FIFO and the output signal table are read, and the keyword within the model description is replaced with another appropriately for each output signal name, and thus a file with a file name "OrigFifo output signal name.h" is generated for each input signal name. FIG. 28 illustrates a model description of a header file of a sample model output FIFO.

Figure 29:
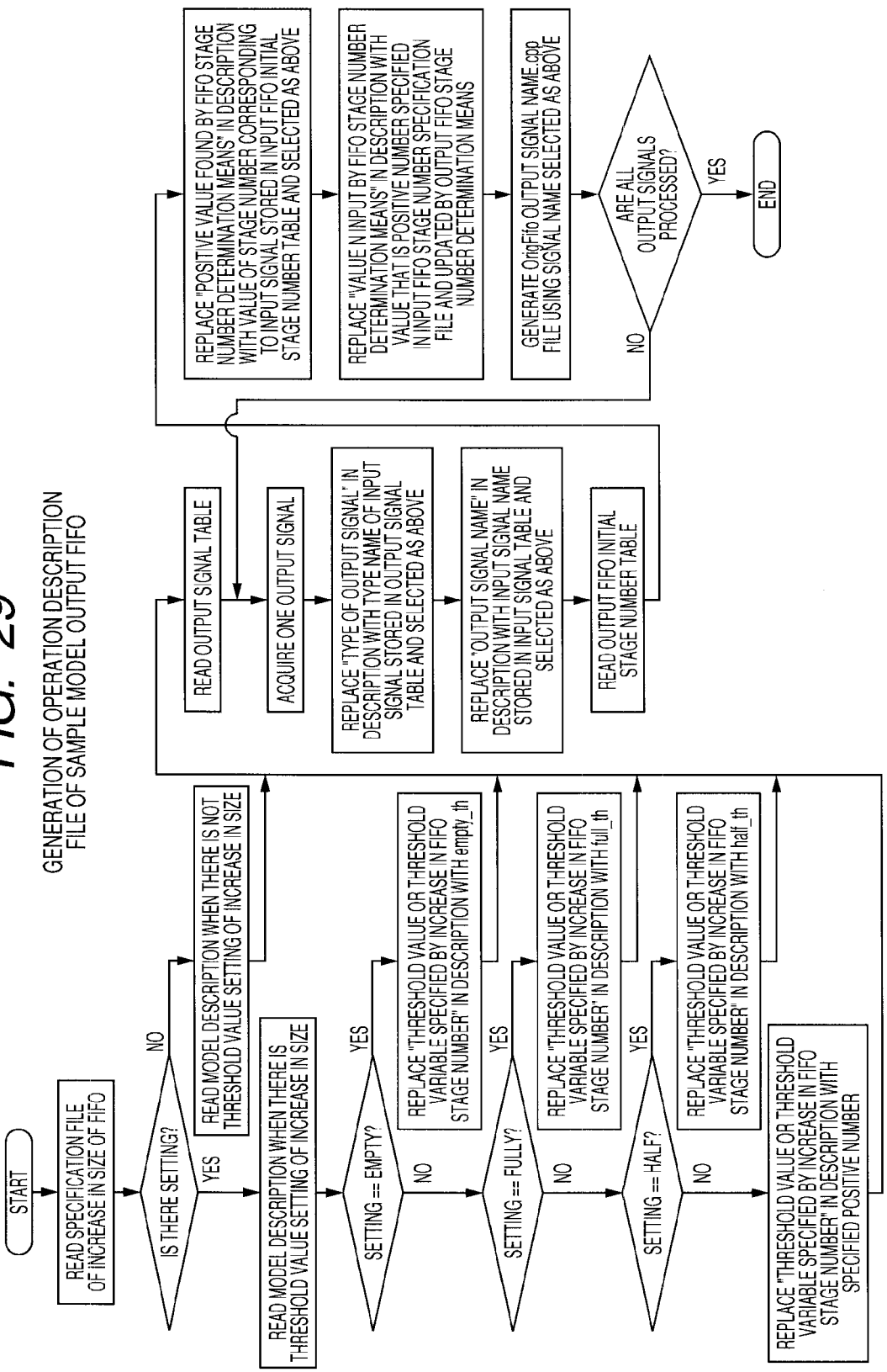
FIG. 29 is a flowchart illustrating a process to generate an operation description file of a sample model output FIFO.

FIG. 29 illustrates a process flow to generate an operation description file of a sample model output FIFO. In this process, the FIFO size up specification file is read, the model description of the sample model output FIFO when there is no threshold value setting of size up or when there is a threshold value setting of size up is read, the output signal table and the output FIFO initial stage number table are read, the keyword within the model description is replaced with another appropriately for each input signal name, and thus a file with a file name "OrigFifo output signal name.cpp" is generated for each input signal name. FIG. 30 to FIG. 32 illustrate a model description of operation description for unconditioned size up of a sample model output FIFO. FIG. 33 to FIG. 35 illustrate the model description of operation description for conditioned size up of a sample model output FIFO.

<<Generation of FIFO Description Relating to Model to be Verified FIFO Pair Group>>

Figure 36:
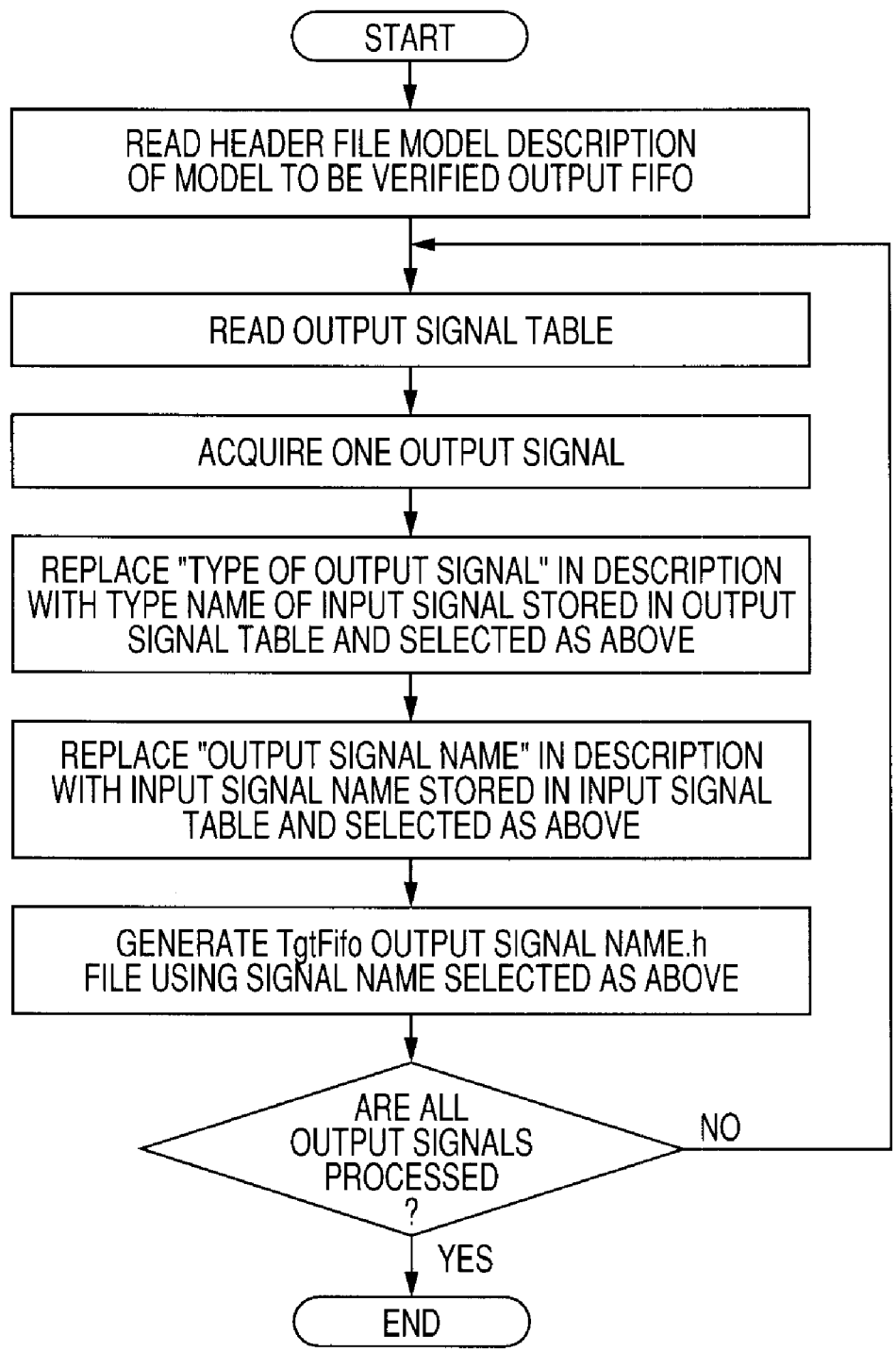
FIG. 36 is a flowchart illustrating a header file generation process of a model to be verified output FIFO.

FIG. 36 shows a process to generate a header file of a model to be verified output FIFO. In this process, the model description of the header file of the model to be verified output FIFO and the output signal table are read, and the keyword within the model description is replaced with another appropriately for each output signal name, and then a file with a file name "TgtFifo output signal name.h" is generated for each input signal name. FIG. 37 illustrates a model description of a header file of a model to be verified output FIFO.

Figure 38:
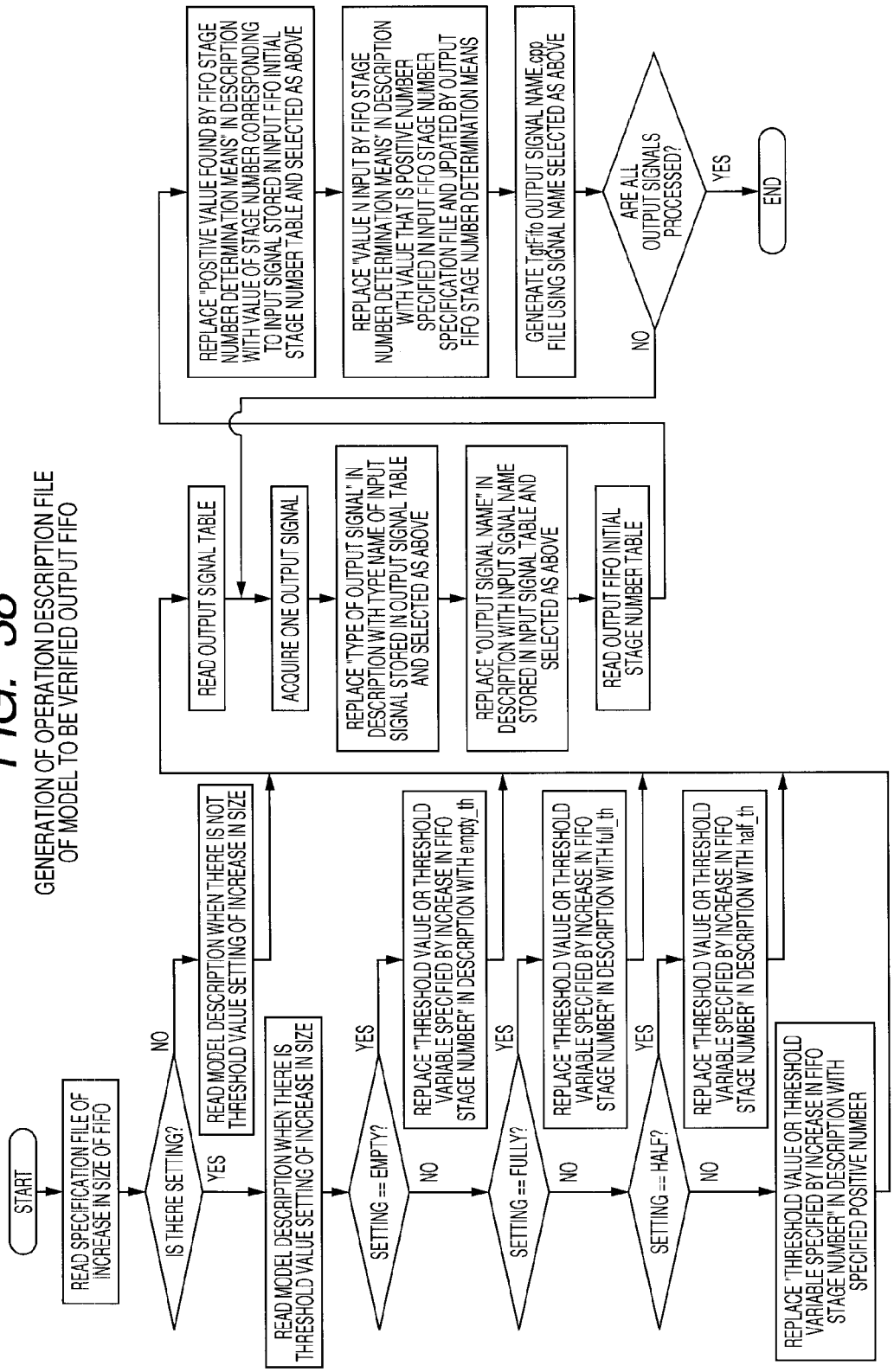
FIG. 38 is a flowchart illustrating a process to generate an operation description file of a model to be verified output FIFO.

FIG. 38 illustrates a process flow to generate an operation description file of a model to be verified output FIFO. In this process, the FIFO size up specification file is read, the model description of the model to be verified output FIFO when there is no threshold value setting of size up or when there is a threshold value setting of size up is read, the output signal table and the output FIFO initial stage number table are read, the keyword within the model description is replaced with another appropriately for each input signal name, and thus a file with a file name "TgtFifo output signal name.cpp" is generated. FIG. 39 to FIG. 41 illustrate a model description of operation description for unconditioned size up of a model to be verified output FIFO. FIG. 42 to FIG. 44 illustrate a model description of operation description for conditioned size up of a model to be verified output FIFO.

<<Generation Process of Coincidence Judgment Model>>

The specifications of the operation of the coincidence judgment model 9 for the output signal value of the output FIFO pair 7 will be described. The signals of "Orig output signal name Empty" and "Tgt output signal name Empty" are received as an input from the sample model output FIFO and the model to be verified output FIFO having the same output signal name, and if both are zero, the signals of "output signal Orig output signal name Read" and "Tgt output signal name Read" are asserted as one, otherwise these two output signals are de-asserted as zero. The signals of "Orig output signal name" and "Tgt output signal name" are received as an input and if both coincide with each other, the output signal "Compare output signal name" is asserted as one, otherwise this output signal is de-asserted as zero.

Figure 45:
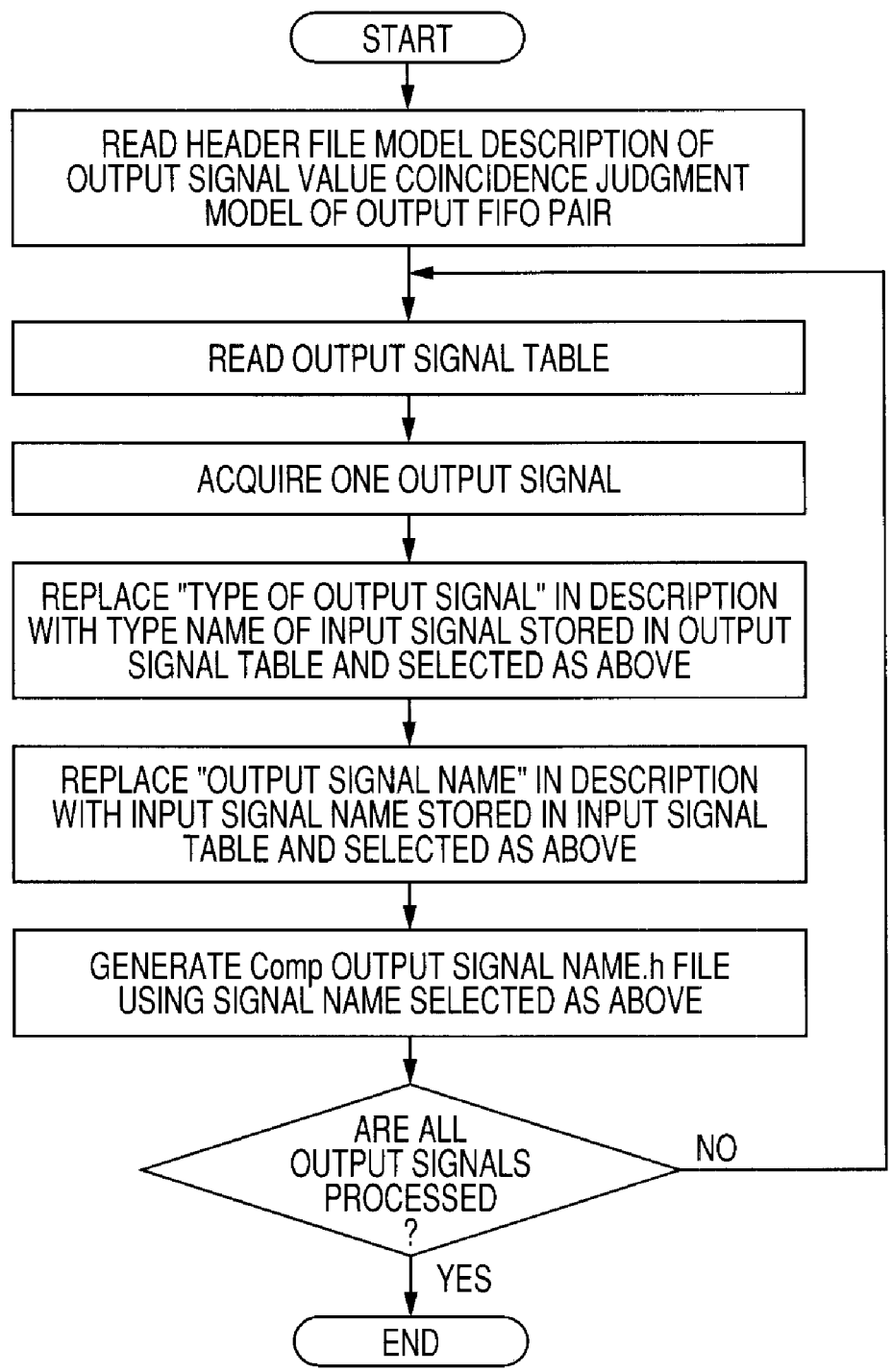
FIG. 45 is a flowchart illustrating a process to generate a header file of an output signal value coincidence judgment model of an output FIFO pair.

FIG. 45 illustrates a process flow to generate a header file of the coincidence judgment model 9 of the output signal value of the output FIFO pair 7. In this process, the header file model description of the coincidence judgment model 9 of the output signal value of the output FIFO pair 7 and the output signal table are read, the keyword within the model description is replaced with another appropriately for each output signal name, and thus a file with a file name "Comp output signal name.h" is generated for each input signal name. FIG. 46 illustrates a model description of a header file relating to the coincidence judgment model 9 of the output signal value of the output FIFO pair 7.

Figure 47:
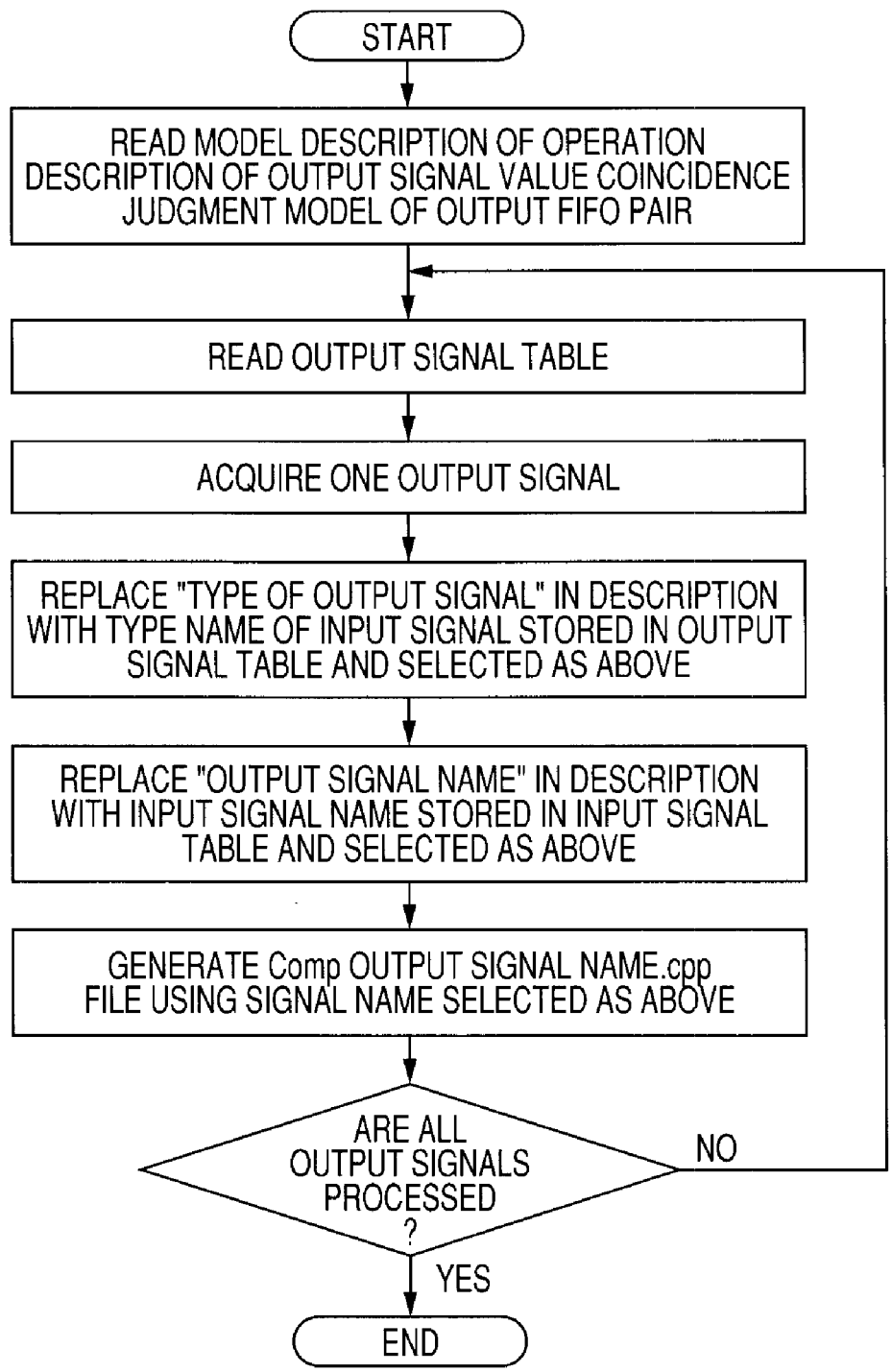
FIG. 47 is a flowchart illustrating a process to generate an operation description of an output signal value coincidence judgment model of an output FIFO pair.

FIG. 47 illustrates a process flow to generate an operation description of the judgment model 9 relating to the output signal value coincidence of the output FIFO pair 7. In this process, the model description of the operation model of the judgment model 9 relating to the output signal value coincidence of the output FIFO pair 7 and the output signal table are read, the keyword within the model description is replaced with another appropriately for each output signal name, and thus a file with a file name "Comp output signal name.cpp" is generated for each input signal name. FIG. 48 illustrates a model description of operation description relating to the output signal value coincidence judgment model 9 of the output FIFO pair 7. In particular, when the output port is of special data type, such as a structure type, if a proper overloading description of the OS (Operating System) is added to the model description of the header file of the output signal value coincidence judgment model of the output FIFO pair and the model description of the operation description of the output signal value coincidence judgment model of the output FIFO pair is modified appropriately, it is possible to deal with the above data type without modifying the generation algorithm.

<<Generation Process of Clock Termination Controller>>

Figure 49:
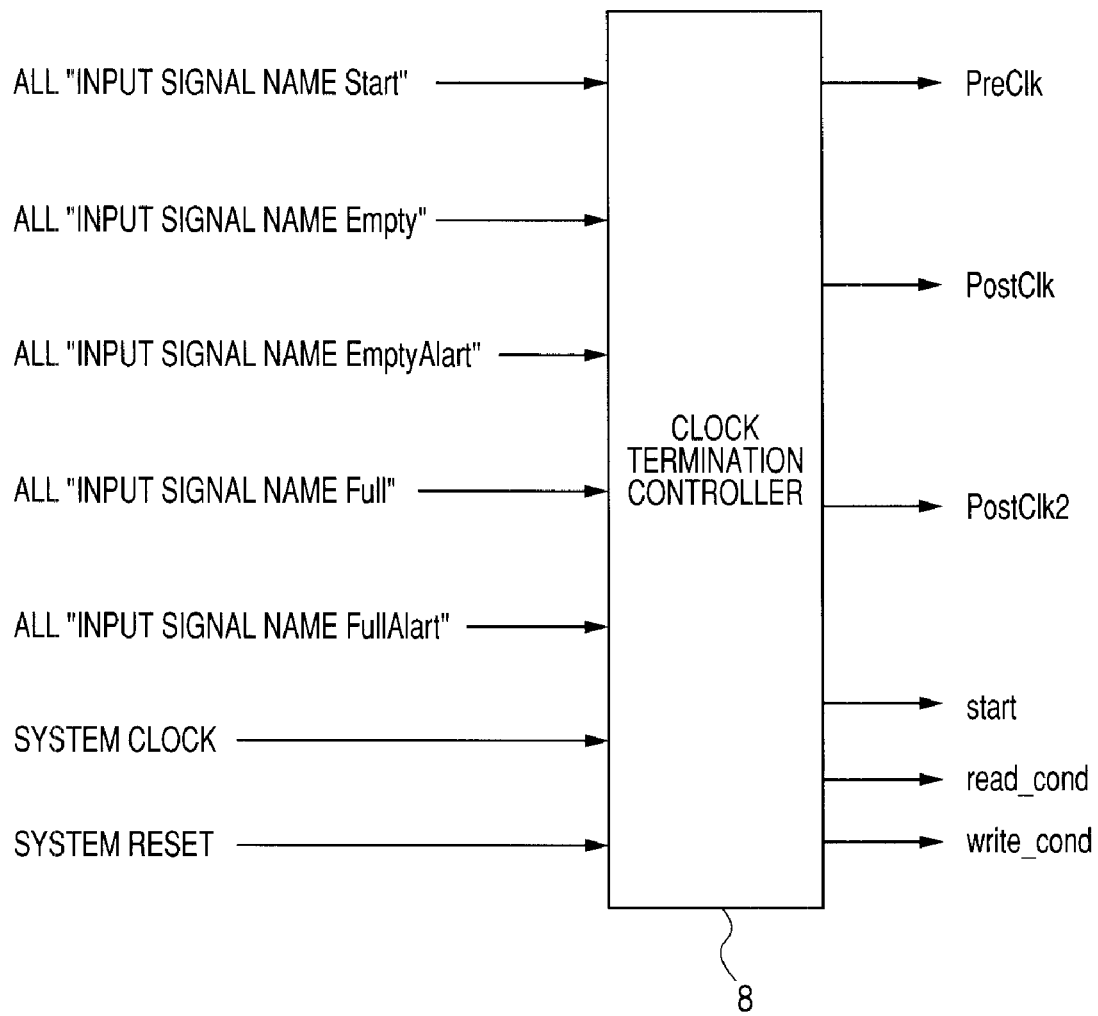
FIG. 49 is an explanatory diagram showing input signals and output signals of a clock termination controller.

FIG. 49 shows input signals and output signals of the clock termination controller 8. The specifications of the operation of the clock termination controller 8 are as follows. 1) The clock termination controller 8 has a function to output a start signal to a model to be verified output FIFO. The result of the logical product of all the input signal names Start is substituted for the internal Bool variable tmp_start and tmp_start is substituted for the output signal start. That is, that all of the input FIFOs are popped for the initial stage number the number of times of a threshold value or more is indicated by start=1. 2) The clock termination controller 8 has a function to supply a clock PreClk to a test bench, a sample model, and a sample model test input fetch model. The result of the logical sum of all the input signal names FullAlart is substituted for the internal Bool variable full_alart, the result of the negation of the logical sum of all the input signal names Full is substituted for the internal Bool variable full, (ful&&¯full_alart||¯tmp_start)&& system clock is substituted for PreClk, and full&&¯full_alart||¯tmp_start is substituted for sc_out variable write_cond. That is, when all the input FIFOs have the number of pieces of data of a certain threshold value or more, or a certain input FIFO is full, the supply of clock is terminated, otherwise the clock is supplied. 3) The clock termination controller 8 has a function to supply the clock PostClk to a model to be verified test input/output model. The result of the logical sum of all the input signal names EmptyAlart is substituted for the internal Bool variable empty_alart, the result of the negation of the logical sum of all the input signal names Empty is substituted for the internal Bool variable empty, empty&&¯empty_alart&&tmp_start is substituted for the internal Bool variable tmp_read_cond, and tmp_read_cond&& system clock is substituted for PostClk. That is, when all the input FIFOs have the number of pieces of data of a certain threshold value or less, or a certain input FIFO is empty, the supply of clock is terminated, otherwise the clock is supplied. 4) A clock PostClk 2 is supplied to a model to be verified. The tmp_read_cond is input to a 1-bit Flip-Flop via the sc_out variable read_cond of bool type and the read_cond2&& system clock is substituted for PostClk using the sc_signal variable read_cond 2 of bool type, which is an output thereof. That is, clock supply termination/supply is performed with one clock delay from PostClk.

A header file of the clock termination controller 8 is generated as follows. That is, an output signal table is read, a system clock, a system reset, and respective input signals of bool type to the end of respective signal names of which Start, Empty, EmptyAlart, Full, or FullAlart are attached are defined, a module name is set to Control, an operation thread to be registered to SC_METHOD is set to ctrl, an operation thread to be registered to SC_CTHREAD to realize Flip-Flop is set to FF, and thus a header file Control.h that has described an output signal declaration of Bool type is generated. Here, to the sensitivity list to the SC_METHOD process, all the input signals and the system clock are registered. In this manner, a header file can be generated from the output signal table by a typical process, and therefore, the possibility of the automatic generation is obvious, and therefore, its detailed description is omitted. Also, as for the generation of an operation description file of the clock termination controller, it is obvious from its specifications of operation that the output signal table is read and an operation description file Control.cpp is automatically generated, and therefore, its detailed description is omitted. FIG. 50 illustrates a header file description of the clock termination controller. FIG. 51 illustrates an operation description of the clock termination controller 8.

<<Total Connection Process>>

By organizing the model generated in the above process using a computer and the input model, the following modules can be obtained. 1) The module of a test bench as the sample model test vector generation model 3, 2) the module of the sample model 1, 3) the module of the model to be verified 2, 4) the module including the sample model test input fetch model 4, the input FIFO group 5, and the model to be verified test input/output model 6, 5) the module group of the sample model output FIFO constituting the output FIFO pair 7, 6) the module group of the model to be verified output FIFO constituting the output FIFO pair 7, 7) the module of the clock termination controller 8, and 8) the module of the output coincidence judgment model 9. Here, the connection of the modules of the clock termination controller 8 has already been described in the description of the clock termination process. Basically, it is only required to connect the modules having corresponding input signal names and those having corresponding output signal names, however, the sample model 1 and the model to be verified 2 have the same output signal, and therefore, they cannot be connected as they are. Here, the module of the sample model 1 and the module group of the sample model output FIFO are put together into one hierarchy and the module of the model to be verified 2 and the module group of the model to be verified output FIFO are put together into another hierarchy, and thus the top module is configured and then is connected to the remaining modules. Since all of the signal names and the module names are given, it is only required to create a module representative of the hierarchy introduced as above and configure a signal declaration therein and an instance declaration description of the included modules to carry out port connection, and further configure a signal declaration within the top module and instantiate the modules created in the hierarchy and the respective remaining modules, and then make port connection. Since all of the signal names, module names, connection relations, and hierarchical structures are given according to the format of the System C, it is obvious that the total connection description can be generated automatically, and therefore, its detailed description is omitted.

According to the generation method of the development environment described above, the following functions and effects can be obtained.

With the conventional design technique, after the RTL or model as the result of composition is analyzed, the modification portions of the test bench are identified and the test bench is modified manually, and thus the verification environment of RTL as the result of the composition is constructed. When many candidates of RTL are generated, the manual modification of the test bench and the construction of the test bench are required for all of them and it is difficult to realize the actual generation of such many candidates of RTL and the determination of the optimum RTL. With the technique of the present invention described above, the utilization of the test bench is automated, and therefore, it is made possible to generate many candidates of RTL and search for the optimum solution.

It is possible to reduce the number of processes to construct the verification environment for the IP (Intellectual Property) development using the operation composition. Further, it is also possible to automatically verify the generated RTL in the generation of various RTLs from the same model using the operation composition. Furthermore, it is possible to improve the efficiency of design for all of the products, such as an SoC (System on Chip) and a microcomputer.

The technique to generate the development environment described above has the following superiority to the above-described patent documents 1 to 3.

Patent document 1 determines equivalence only when the order of waveforms in the transition of signal values coincides with each other, and therefore, when, for example, the order of generation of port signals having no data dependence relation among them is modified and implemented in RTL implementation, they are determined to be discrepant even if the RTL implementation maintains the function of the circuit description described in the system level design language. In the present invention, equivalence can be determined even in such a case. This is because the equivalence determining technique is realized in which the same test bench is used also for the model to be verified.

Patent document 2 premises that the detailed internal process result of the operation composition tool can be accessed, however, in general, it is very difficult for anyone other than the original operation composition developer to access such information. Further, how the internal process is configured depends on the implementation of the operation composition tool and in particular, in the case of the pipeline composition, it cannot be said that the equivalence checking can be done directly using only the disclosed technique. In the case of the present invention, it is possible to carry out the equivalence checking with any composition result description including the pipeline composition using the test bench without modifying the test bench used when the description input to the operation composition is verified.

Patent document 3 requires the description of the test bench for the input description and the output result RTL, respectively. In the case of the present invention, it is possible to utilize the test bench described for the purpose of checking the input description of the operation composition without modifying the output RTL of the operation composition result.

The present invention made by the inventors will be described specifically based on the embodiments as above, however, it is obvious that the present invention is not limited to the embodiments, but there can be many modifications within the scope not departing from its gist.

It is assumed that when Port is not a Pin level, such as sc_in/sc_out, but the TLM Port, such as sc_port/sc_export, the connection should be made between the TLM Ports and when the RTL description and the System C description are connected, the description for the co-simulation of RTL and System C that a commercially available simulator requires are prepared separately. Here, the description for co-simulation can be automatically generated with a commercially available simulator. In addition, the description for the co-simulation can be generated automatically by preparing a model description, acquiring port information, and combining both because the descriptions other than that relating to the port are given in a fixed format if the port information exists.

Figure 52:
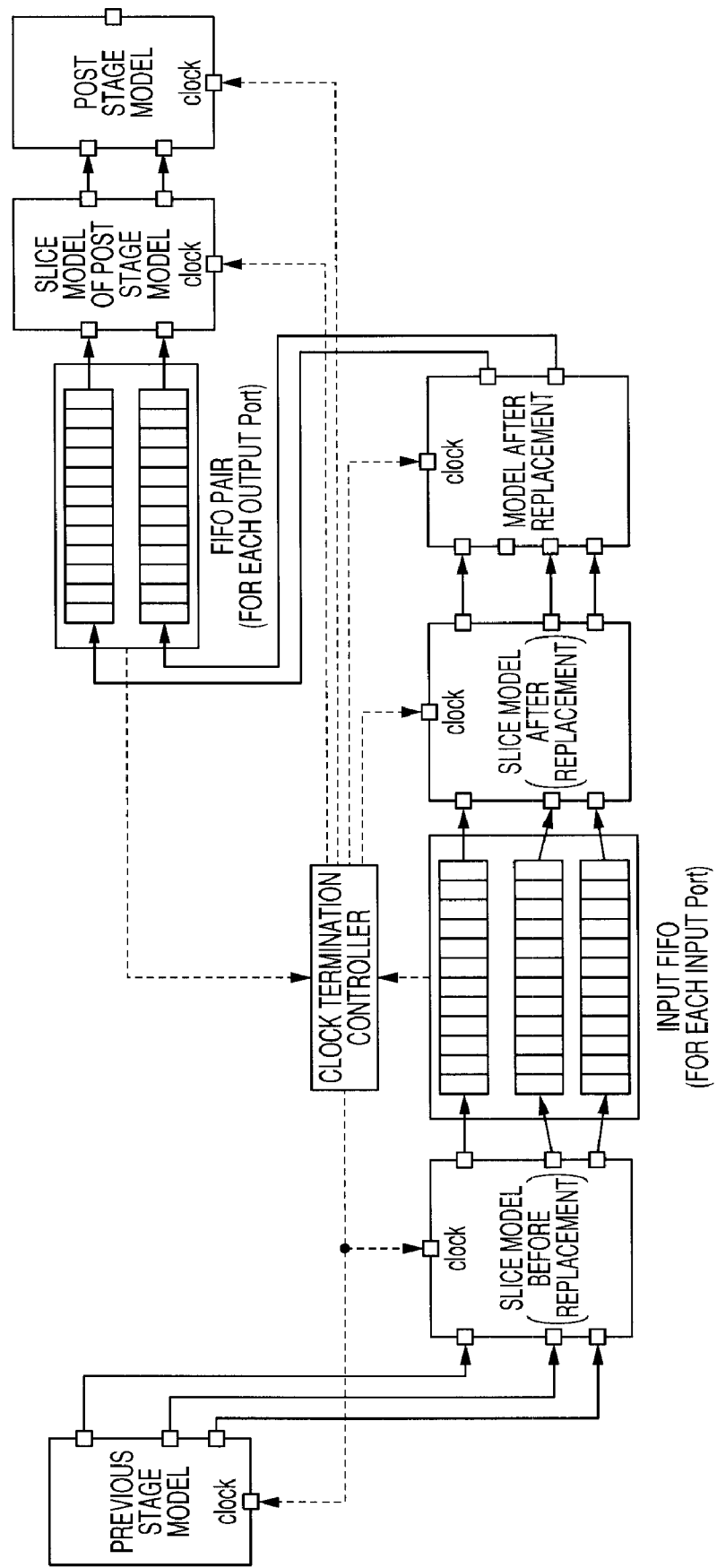
FIG. 52 is an explanatory diagram illustrating a configuration of a virtual test environment when the present invention is applied to the case where part of a system is replaced with another for verification.

The present invention can also be applied to the case where part of the system is replaced with another and then verification is made. In this case, for example, as illustrated in FIG. 52, it is only required to arrange, in the pre-stage of the model to be replaced, the model slice of the model before replacement, the input FIFO pair, and the modified model after replacement and to arrange, in the post-stage, the FIFO group having the same configuration as that of the input FIFO pair and the modified model of the post-stage connection model, and then carry out total connection after arranging the clock termination control model. In the figure, the post-stage model and the pre-stage model are separated completely, however, such a restriction is not necessary. This is because, for example, when there is an output to the pre-stage model, it is only required to connect the input FIFO pair and the slice model of the pre-stage model to the input to the pre-stage model and then connect the output of the model after the replacement to the input FIFO pair. It is assumed here that a user carries out the library registration to the clock termination control model as the need arises. In the case of the example in FIG. 52, the model will be one that receives a signal input from the two input FIFO pairs and outputs the FIFO increase instruction signal and the PreEnable and Post Enable signals to each of them.

What is claimed is:

1. An equivalence checking method of a model to be verified using a sample model a circuit of which has been described in a predetermined language and a sample model test vector generation model for the sample model, as processes to be executed by a computer, respectively, the method comprising:

a first process in which the sample model inputs/outputs a signal from/to the sample model test vector generation model with cycle accuracy;

a second process for controlling writing an output from the sample model test vector generation model into an input FIFO group for each signal of the sample model with a timing same as that of the sample model;

a third process for reading data from the input FIFO group with the same operation timing as that of the model to be verified and outputting the data to the model to be verified;

a fourth process for writing an output of the sample model and an output of the model to be verified into an output FIFO pair group for each corresponding signal name; and a fifth process for carrying out coincidence judgment for a pair output for each signal name of the output FIFO pair group.

2. The equivalence checking method according to claim 1, wherein the execution of the first process and the second process is terminated when all of input FIFOs in the input FIFO group come to hold data a number of pieces of which is not less than a number specified by a first input FIFO threshold value or when at least one of the input FIFOs becomes full, and those processes are executed in other states.

3. The equivalence checking method according to claim 1, wherein the execution of the third process and the fourth process is started when all of input FIFOs in the input FIFO group come to hold data the number of pieces of which is a predetermined number or more.

4. The equivalence checking method according to claim 3, wherein the third process and fourth process the execution of which has been started are terminated when all of the input FIFOs in the input FIFO group come to hold data a number of pieces of which is not more than a number specified by a second input FIFO threshold value or when at least one of the input FIFOs becomes empty, and those processes are executed in the other states.

5. The equivalence checking method according to claim 1, further comprising an upsizing process, as a process to be executed by a computer, to increase a number of FIFO stages each time a number of pieces of data held by input FIFO reaches a predetermined number.

6. The equivalence checking method according to claim 5, wherein that the number of pieces of data held by the input FIFO reaches a predetermined number means that a difference between the value of a write pointer of the input FIFO and that of a read pointer of the input FIFO becomes a third input FIFO threshold value or more.

7. The equivalence checking method according to claim 6, wherein the third input FIFO threshold value is a number increased in accordance with a variable to be increased for the upsizing process.

8. The equivalence checking method according to claim 1, further comprising an upsizing process, as a process to be executed by a computer, to increase a number of FIFO stages each time a number of pieces of data held by output FIFO reaches a predetermined number.

9. The equivalence checking method according to claim 8, wherein that the number of pieces of data held by the output FIFO reaches a predetermined number means that a difference between the value of a write pointer of the output FIFO and that of a read pointer of the output FIFO becomes an output FIFO threshold value or more.

10. The equivalence checking method according to claim 9,
wherein the output FIFO threshold value is a number increased in accordance with a variable to be increased for the upsizing process.

11. An equivalence checking program causing a computer to execute first to fifth processes for equivalence checking of a model to be verified using a sample model a circuit of which has been described in a predetermined language and a sample model test vector generation model for the sample model, wherein:
the first process is a process in which the sample model inputs/outputs a signal from/to the sample model test vector generation model with cycle accuracy;
the second process is a process for controlling writing an output from the sample model test vector generation model into an input FIFO group for each signal of the sample model with a timing same as that of the sample model;
the third process is a process for reading data from the input FIFO group with the same operation timing as that of the model to be verified and outputting the data to the model to be verified;
the fourth process is a process for writing an output of the sample model and an output of the model to be verified into an output FIFO pair group for each corresponding signal name; and
the fifth process is a process for carrying out coincidence judgment for a pair output for each signal name of the output FIFO pair group.

12. The equivalence checking program according to claim 11,
wherein the execution of the first process and the second process is terminated when all of input FIFOs in the input FIFO group come to hold data a number of pieces of which is not less than a number specified by a first input FIFO threshold value or when at least one of the input FIFOs becomes full and those processes are executed in other states.

13. The equivalence checking program according to claim 11,
wherein the execution of the third process and the fourth process is started when all of input FIFOs in the input FIFO group come to hold data the number of pieces of which is a predetermined number or more.

14. The equivalence checking program according to claim 13,
wherein the third process and fourth process the execution of which has been started are terminated when all of the input FIFOs in the input FIFO group come to hold data a number of pieces of which is not more than a number specified by a second input FIFO threshold value or when at least one of the input FIFOs becomes empty and those processes are executed in other states.

15. The equivalence checking program according to claim 11, further comprising an upsizing process, as a process to be executed by a computer, to increase a number of FIFO stages each time a number of pieces of data held by input FIFO reaches a predetermined number.

16. The equivalence checking program according to claim 15,
wherein that the number of pieces of data held by the input FIFO reaches a predetermined number means that a difference between the value of a write pointer of the input FIFO and that of a read pointer of the input FIFO becomes a third input FIFO threshold value or more.

17. The equivalence checking program according to claim 16,
wherein the third input FIFO threshold value is a number increased in accordance with a variable to be increased for the upsizing process.

18. The equivalence checking program according to claim 11, further comprising an upsizing process, as a process to be executed by a computer, to increase a number of FIFO stages each time a number of pieces of data held by output FIFO reaches a predetermined number.

19. The equivalence checking program according to claim 18,
wherein that the number of pieces of data held by the output FIFO reaches a predetermined number means that a difference between the value of a write pointer of the output FIFO and that of a read pointer of the output FIFO becomes an output FIFO threshold value or more.

20. The equivalence checking program according to claim 19,
wherein the output FIFO threshold value is a number increased in accordance with a variable to be increased for the upsizing process.

21. A generating method of equivalence checking program for equivalence checking of a model to be verified using a sample model a circuit of which has been described in a predetermined language and a sample model test vector generation model for the sample model, as processes executed by a computer, respectively, the method comprising:
a process for reading the sample model, the sample model test vector generation model, and a parameter setting file into a computer;
a process for generating a sample model test input fetch model in order to carry out an operation to write data that the sample model inputs from the sample model test vector generation model into an input FIFO group with cycle accuracy;
a process for generating a model to be verified test input/output model in order to carry out an operation to read data from the input FIFO group in accordance with an operation timing of the model to be verified and output the data to the model to be verified;
a process for generating a model of the input FIFO group based on the sample model test input fetch model and model to be verified test input/output model;
a process for generating an output FIFO pair group that inputs and holds an output of the sample model and an output of the model to be verified for each corresponding signal name; and
a process for generating a coincidence judgment model that carries out a coincidence judgment of an output pair of each signal name of the output FIFO pair group.

* * * * *